(12) United States Patent
Noda et al.

(10) Patent No.: US 10,526,707 B2
(45) Date of Patent: Jan. 7, 2020

(54) HEAT EXCHANGER TYPE REACTION TUBE

(71) Applicants: The University of Tokyo, Bunkyo-ku, Tokyo (JP); HITACHI CHEMICAL COMPANY, LTD., Tokyo (JP)

(72) Inventors: Suguru Noda, Tokyo (JP); Dong Young Kim, Tokyo (JP); Yusuke Kon, Tokyo (JP); Zhongming Chen, Tokyo (JP); Eisuke Haba, Tsukuba (JP); Shunsuke Ueda, Tsukuba (JP)

(73) Assignees: THE UNIVERSITY OF TOKYO, Tokyo (JP); HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/424,248

(22) PCT Filed: Jul. 28, 2013

(86) PCT No.: PCT/JP2013/073050
§ 371 (c)(1),
(2) Date: Feb. 26, 2015

(87) PCT Pub. No.: WO2014/034739
PCT Pub. Date: Mar. 6, 2014

(65) Prior Publication Data
US 2015/0218699 A1 Aug. 6, 2015

(30) Foreign Application Priority Data
Aug. 29, 2012 (JP) .................................. 2012-189305

(51) Int. Cl.
*C23C 16/46* (2006.01)
*C23C 16/455* (2006.01)
(Continued)

(52) U.S. Cl.
CPC ............. *C23C 16/46* (2013.01); *B01J 8/0025* (2013.01); *B01J 8/1818* (2013.01); *B01J 8/1827* (2013.01);
(Continued)

(58) Field of Classification Search
CPC ..... C23C 16/46; C23C 16/458; C23C 16/455; B01J 19/02; B01J 8/0025; B01J 8/1818;
(Continued)

(56) References Cited

U.S. PATENT DOCUMENTS

| 1,803,306 A | 4/1931 | Stengel |
| 3,251,337 A | 5/1966 | Latta et al. |

(Continued)

FOREIGN PATENT DOCUMENTS

| CN | 1315291 A | 10/2001 |
| CN | 102076605 A | 5/2011 |

(Continued)

OTHER PUBLICATIONS

Search Report in counterpart EP Application No. 13833410.7 dated Jun. 6, 2016 in English.
(Continued)

*Primary Examiner* — Jeffrie R Lund
(74) *Attorney, Agent, or Firm* — Fitch, Even, Tabin & Flannery LLP

(57) ABSTRACT

A heat exchanger type reaction tube includes a first tube part that forms a first flow channel into which a feed gas flows and in which the feed gas moves down; a second tube part that forms a second flow channel which is connected to the first flow channel and in which the feed gas moves up and that has a granular catalyst carrying support medium charged therein; and a heating device that heats the first tube part and the second tube part. Then, the first flow channel and the second flow channel are adjacent to each other while
(Continued)

being separated from each other by a partition wall, and the second flow channel is provided with a distributor which holds the catalyst carrying support medium and through which the feed gas passes.

11 Claims, 35 Drawing Sheets

(51) Int. Cl.
| | | |
|---|---|---|
| C23C 16/458 | (2006.01) | |
| C01B 32/16 | (2017.01) | |
| B01J 19/02 | (2006.01) | |
| B01J 8/00 | (2006.01) | |
| B01J 8/18 | (2006.01) | |
| B82Y 40/00 | (2011.01) | |

(52) U.S. Cl.
CPC ............ B01J 8/1836 (2013.01); B01J 19/02 (2013.01); C01B 32/16 (2017.08); C23C 16/455 (2013.01); C23C 16/458 (2013.01); B01J 2208/0053 (2013.01); B01J 2208/00061 (2013.01); B01J 2208/00194 (2013.01); B01J 2208/00203 (2013.01); B01J 2208/00415 (2013.01); B01J 2208/00548 (2013.01); B01J 2208/00884 (2013.01); B01J 2208/00991 (2013.01); B01J 2219/0254 (2013.01); B82Y 40/00 (2013.01)

(58) Field of Classification Search
CPC .................. B01J 8/1827; B01J 8/1836; B01J 2208/00194; B01J 2208/00203; B01J 2208/0053; B01J 2208/00548; B01J 2208/00991; B01J 2219/0254; B01J 2208/00061; B01J 2208/00884; B01J 2208/00415; C01B 31/0226; B82Y 40/00
See application file for complete search history.

(56) References Cited

U.S. PATENT DOCUMENTS

| | | | | |
|---|---|---|---|---|
| 3,737,283 A * | 6/1973 | Nikles | ..................... | F27B 15/10 239/423 |
| 4,040,815 A * | 8/1977 | Francois | ................... | B22F 9/12 75/367 |
| 4,080,927 A * | 3/1978 | Brown | ................... | G21C 3/626 118/716 |
| 4,116,160 A * | 9/1978 | Langley | ................. | G21C 3/626 118/716 |
| 4,221,182 A * | 9/1980 | Brown | ..................... | B01J 13/04 118/716 |
| 4,271,207 A * | 6/1981 | Loser | ................... | C23C 16/442 118/716 |
| 6,413,487 B1 * | 7/2002 | Resasco | ................. | B01J 8/0055 423/447.3 |
| 6,827,786 B2 * | 12/2004 | Lord | ........................ | B01J 8/003 118/716 |
| 9,212,421 B2 * | 12/2015 | Miller | ..................... | C23C 16/06 |
| 9,732,420 B2 * | 8/2017 | Weckesser | ............ | C01B 33/027 |
| 2003/0157000 A1 * | 8/2003 | Janssen | ............. | H01J 37/32009 422/139 |
| 2008/0145553 A1 * | 6/2008 | Boulos | ................... | B01J 19/088 427/447 |
| 2009/0047204 A1 * | 2/2009 | Kim | ..................... | C01B 33/027 423/349 |
| 2009/0324479 A1 * | 12/2009 | Kulkarni | ................ | B01J 8/1818 423/350 |
| 2010/0242361 A1 * | 9/2010 | Vail | ........................ | B01J 8/1836 48/77 |
| 2011/0040048 A1 * | 2/2011 | Terry | ....................... | B01J 4/002 526/59 |
| 2011/0315079 A1 * | 12/2011 | Perpar | ........................ | B01J 2/16 118/716 |
| 2014/0193570 A1 * | 7/2014 | Brothier | .............. | C23C 16/4417 427/6 |
| 2015/0218699 A1 * | 8/2015 | Noda | ...................... | C23C 16/46 118/725 |

FOREIGN PATENT DOCUMENTS

| | | | |
|---|---|---|---|
| CN | 102389753 A | | 3/2012 |
| JP | 57135708 A | * | 8/1982 |
| JP | 8301602 A | | 11/1996 |
| JP | 2001-115348 A | | 4/2001 |
| JP | 2002211904 A | | 7/2002 |
| JP | 200395614 A | | 4/2003 |
| JP | 2003286015 A | | 10/2003 |
| JP | 2004-526660 A | | 9/2004 |
| JP | 2009161426 A | | 7/2009 |
| KR | 10-2009-0073344 A | | 7/2009 |
| WO | 2006/033367 A1 | | 3/2006 |
| WO | 2014/046972 A1 | | 3/2014 |
| WO | 2015/023438 A1 | | 2/2015 |

OTHER PUBLICATIONS

International Search Report for International Patent Application No. PCT/JP2013/073050 dated Oct. 29, 2013.

Office Action in counterpart Chinese Office Action of Appln. No. 201380045004.5 dated Dec. 23, 2015.

* cited by examiner (a)

| | | Ar (gas) | Ar (Cat.) | H2O 600ppmv | H2 26vol% | C2H2 1.1vol% | O2 | Al -isopropoxide | Ferrocene | Total flow |
|---|---|---|---|---|---|---|---|---|---|---|
| Deposition (2 min) | FIRST CATALYST SOURCE GAS | 12 | 1 | 0 | 0 | 0 | 8 | 0.225 | 0 | 21.225 |
| | SECOND CATALYST SOURCE GAS | 12 | 1 | 0.3 | 0 | 0 | 8 | 0 | 0.125 | 21.425 |
| Reduction (10 min) | REDUCING GAS | 5.79 | 1 | 0.21 | 2.485 | 0 | 0 | 0 | 0 | 9.48 |
| CVD (20 min) | FEED GAS | 5.28 | 1 | 0.21 | 2.485 | 0.508 | 0 | 0 | 0 | 9.48 |

(a)

(b)

(a)

(b)

(a)

(b)

HEAT EXCHANGER TYPE REACTION TUBE

TECHNICAL FIELD

The present invention relates to a heat exchanger type reaction tube that causes a reaction of a heated gas on a fluidization medium.

BACKGROUND ART

Hitherto, a reaction tube which is used to synthesize a carbon nanotube by a fluid bed process is formed in a tube shape extending straightly. Then, a distributor provided with penetration holes is disposed inside the reaction tube, and a heating device is disposed outside the reaction tube. When a carbon nanotube is synthesized by using such a reaction tube, a granular carrying medium that carries catalytic particles is first charged in the reaction tube so that the granular carrying medium is held by the distributor. Next, a feed gas is supplied from the lower side of the reaction tube while the reaction tube is heated by the heating device, and the granular carrying medium is fluidized by the feed gas. Accordingly, the feed gas is circulated on the granular carrying medium, and the carbon nanotube is grown from carbon nanotube synthesis catalysts carried by the granular carrying medium.

CITATION LIST

Patent Literature

Patent Literature 1: JP 2002-211904 A

SUMMARY OF INVENTION

Technical Problem

In the synthesis of the carbon nanotube according to such a fluid bed process, it is important to manage the temperature of the feed gas.

However, in the existing tubular reaction tube that extends straightly, the feed gas is heated by the heating device while passing through the granular carrying medium held by the distributor. For this reason, the temperature of the feed gas becomes lower than the set temperature at the downstream side inside the heat exchanger type reaction tube, and hence the temperature of the feed gas inside the heat exchanger type reaction tube becomes non-uniform. Moreover, since an increase in temperature of the feed gas is suppressed to be low as the flow rate of the feed gas increases, the temperature of the feed gas inside the heat exchanger type reaction tube becomes largely different from the set temperature. As a result, a problem arises in that the carbon nanotube may not be effectively synthesized. Further, since a large amount of fuel or electric power is necessary for heating the feed gas and a gas having a large amount of heat energy flows out of the outlet of the reaction tube, the heat loss is large and the cost increases.

Therefore, an object of the invention is to provide a heat exchanger type reaction tube having high heat uniformity and small heat loss.

Solution to Problem

According to the invention, provided is a heat exchanger type reaction tube including: a first tube part that forms a first flow channel into which a first gas flows and in which the first gas moves down; a second tube part that is connected to the lower portion of the first flow channel, that forms a second flow channel in which the first gas moves up, and that holds a fluidization medium; and a heating device that covers the first tube part and the second tube part, wherein the first flow channel and the second flow channel are adjacent to each other while being separated from each other by a partition wall, and wherein the second flow channel is provided with a distributor which holds the fluidization medium and through which the first gas passes.

In the heat exchanger type reaction tube according to the invention, the first gas flows into the first flow channel of the first tube part, and flows into the second flow channel of the second tube part in which the fluidization medium is charged. At this time, since the first gas is heated by all of the first tube part and the second tube part heated by the heating device and is also heated by the high-temperature reacted gas flowing out of the second tube part, the first gas is preheated when passing through the first flow channel, and hence the first gas is already sufficiently heated at the time point in which the first gas flows into the second flow channel. Accordingly, the first gas that flows through the second flow channel has a uniform temperature from the upstream side to the downstream side, and hence the first gas having high heat uniformity is circulated on the catalyst carrying support medium. Accordingly, the reaction of the first gas may effectively occur on the fluidization medium. Meanwhile, the first gas which is sufficiently heated flows to the lower portion (the distributor side) of the second tube part, and the periphery of the second tube part is covered by the high-temperature first tube part and the heating device. For this reason, the first gas which moves up in the second flow channel may be maintained at a high temperature while not being cooled. Since the upper portion (the outlet side) of the second tube part contacts the first tube part which is not sufficiently heated, the high-temperature reacted first gas which flows out of the second tube part is cooled by the low-temperature first gas flowing into the first tube part, and the first gas which flows into the first tube part is heated by the first gas flowing out of the second tube part. In this way, a heat exchange operation is performed. Accordingly, since most of energy necessary for heating the gas flowing into the first tube part may be obtained from the reacted first gas flowing out of the second tube part, the energy input to the heating device may be reduced, and the cooling of the reacted first gas flowing out of the second tube part may be also simplified. Moreover, since the first flow channel and the second flow channel are adjacent to each other and the first gas is preheated in the first flow channel, the heat exchanger type reaction tube may be provided in a compact size.

In this case, the first tube part and the second tube part may be formed as a double-tube structure in which the second tube part is disposed inside the first tube part. Further, the first tube part may be formed as a single or plural tubes, and the first tube part and the second tube part may be formed as a structure in which the first tube part is disposed outside the second tube part. When the first tube part and the second tube part are disposed in this way, the side wall of the second tube part becomes the partition wall between the first flow channel and the second flow channel. Accordingly, since the first tube part does not exist inside the second tube part, the fluidization medium may be satisfactorily fluidized.

Further, the fluidization medium may be a granular catalyst carrying support medium that carries carbon nanotube synthesis catalysts, and the first gas may be a feed gas that contains a carbon source of a carbon nanotube. Accordingly, since the granular catalyst carrying support medium is fluidized by the feed gas having high heat uniformity, the carbon nanotube may be effectively synthesized.

Further, the heat exchanger type reaction tube may further include a third tube part that is connected to the second flow channel while not to the first flow channel and that forms a third flow channel into which a second gas flows. With such a configuration, the second gas flows into the second flow channel in a short staying time while not remaining to exchange heat with the other parts. In this case, the first flow channel may be disposed at a position where the preheating of the first gas by the heat exchange with the heating device and the second flow channel is promoted, and the third flow channel may be disposed at a position where the preheating of the second gas by the heat exchange with the heating device and the second flow channel is suppressed. For this reason, even when a gas decomposed independently at a high temperature is used as the second gas, it is not until the gas contacts with the high-temperature fluidization medium at the second flow channel that the gas is decomposed without the decomposition of the gas in the third flow channel, and hence a satisfactory reaction of the second gas occurs on the fluidization medium. Further, since the first gas and the second gas are mixed with each other inside the second flow channel, the first gas and the second gas may be set to a temperature suitable for the reaction.

Further, the distributor may be placed at the lower end of the second flow channel, and the third flow channel may be connected to the distributor. When the distributor and the third flow channel are disposed in this way, the second gas may be supplied to the second flow channel while the length of the third flow channel is shortened and the heating and the decomposing of the second gas inside the third flow channel are suppressed.

Further, the fluidization medium may be a granular support medium, the first gas may be a feed gas containing a carbon source of a carbon nanotube, and the second gas may be a catalyst source gas containing carbon nanotube synthesis catalysts. Since the catalyst source gas flows from the third flow channel into the second flow channel, a reaction of the catalyst source gas may occur on the high-temperature support medium while the catalyst source gas is sent to the support medium in a low-temperature state. Accordingly, for example, when the carbon nanotube is synthesized by a CVD process, the catalyst may be carried on the support medium by causing the low-temperature catalyst source gas sent from the third flow channel to contact the high-temperature support medium in the second flow channel, and the feed gas containing the high-temperature carbon source sent from the first flow channel may be decomposed by the catalyst on the high-temperature support medium, so that the carbon nanotube may be effectively synthesized.

Advantageous Effects of Invention

According to the invention, since the heat uniformity of the first gas is high and the heat loss is small in the second tube part, an effective reaction of the first gas may occur on the fluidization medium.

BRIEF DESCRIPTION OF DRAWINGS

FIG. 3(a) is a schematic front view and FIG. 3(b) is a cross-sectional view taken along the line III(b)-III(b) of FIG. 3(a).

FIG. 6(a) is a picture of the reaction tube having a non-synthetic carbon nanotube and FIG. 6(b) is a picture of the reaction tube having a synthetic carbon nanotube.

FIG. 7(a) is a picture of the heat exchanger type reaction tube having a non-synthetic carbon nanotube and FIG. 7(b) is a picture of the heat exchanger type reaction tube having a synthetic carbon nanotube.

FIG. 30 is a diagram illustrating gas components of a sixth comparative example and a ninth example.

FIG. 32(a) is a picture of the reaction tube to which a catalyst source gas and a feed gas are not supplied, FIG. 32(b) is a picture of the reaction tube to which a catalyst source gas and a feed gas are supplied to synthesize the carbon nanotube, and FIG. 32(c) is a picture of the reaction tube from which the carbon nanotube is separated.

DESCRIPTION OF EMBODIMENTS

Figure 1:
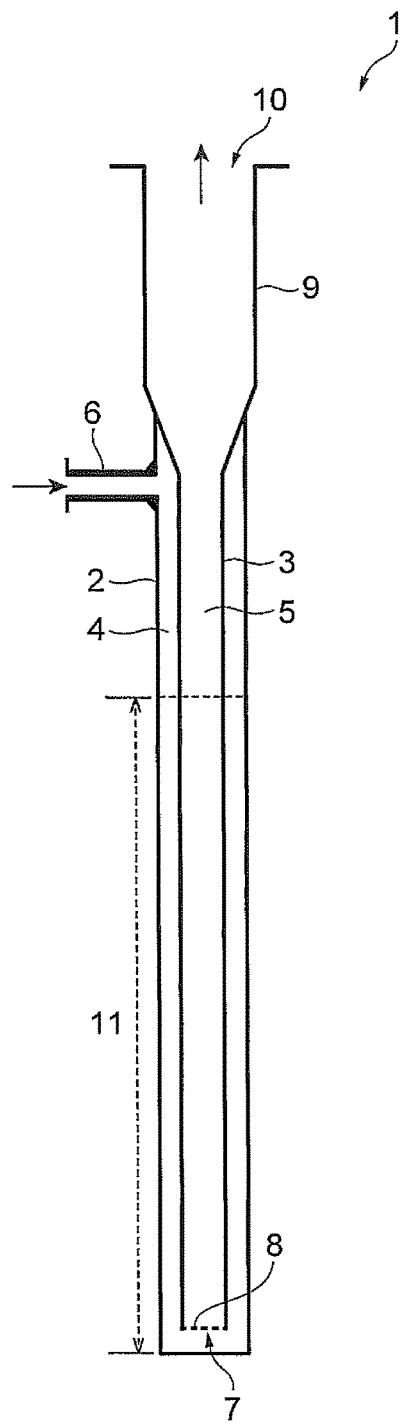
FIG. 1 is a schematic top view of a heat exchanger type reaction tube according to a first embodiment.

Hereinafter, preferred embodiments of a heat exchanger type reaction tube according to the invention will be described in detail with reference to the drawings. In the embodiment, the heat exchanger type reaction tube according to the invention is used as a heat exchanger type reaction tube used when a carbon nanotube is synthesized. Furthermore, the same reference signs will be given to the same or equivalent constituents in all drawings.

[First Embodiment]

A heat exchanger type reaction tube according to a first embodiment synthesizes a carbon nanotube onto a catalyst carrying support medium by circulating a feed gas (a first gas) on a granular catalyst carrying support medium in which catalytic particles (carbon nanotube synthesis catalyst) are carried by a granular support medium (a granular carrying medium).

The catalytic particles are formed by heating and reducing a catalytic raw material such as a metallic oxide film or metal formed on a support medium through a reducing gas such as hydrogen. An inert gas such as argon and nitrogen is used as a carrier gas when the catalytic particles are formed.

In general, it is desirable to choose metal used for the synthesis of the carbon nanotube as the metal of forming the catalytic particles. For example, it is desirable to use metal including one or more elements selected from V, Cr, Mn, Fe, Co, Ni, Cu, Zn, Mo, W, and Au. Among these examples, Fe, Co, and Ni having a large carbon solution amount are particularly desirable.

The support medium which carries the catalytic particles is formed as a granular heat-resistant bead having a heat-resistance property. As the material of the support medium, it is desirable that the material include one or more elements selected from a group of Si, Al, Mg, Zr, Ti, O, N, C, Mo, Ta, and W. As the specific material, oxide such as $SiO_2$, $Al_2O_3$, and MgO, nitride such as $SiN_4$ and AlN, and carbide such as SiC may be exemplified. In particular, compound oxide such as $Al_2O_3$—$SiO_2$ is desirable.

Furthermore, the support medium may include a carrying medium layer for carrying the catalytic particles so that the catalytic particles are carried by the carrying medium layer. As the material of the carrying medium layer, the same material as the support medium may be used. Further, the support medium may have the function of the carrying medium layer, and at this time, the support medium does not need to carry the carrying medium layer.

The feed gas is a gas containing a carbon source decomposed in a heated state and including carbon atom. For example, the feed gas contains a carrier gas and a carbon source for synthesizing a carbon nanotube.

As the carbon source contained in the feed gas, acetylene, ethylene, or ethanol may be used. Acetylene may be contained in the feed gas, and may be generated inside a heat exchanger type reaction tube 1.

As the carrier gas contained in the feed gas, an inert gas such as argon and nitrogen is desirable. Further, hydrogen may be used as the carrier gas.

FIG. 1 is a schematic top view of the heat exchanger type reaction tube of the first embodiment. As illustrated in FIG. 1, the heat exchanger type reaction tube 1 according to the first embodiment is formed as a double-tube structure including a first tube part 2 and a second tube part 3 disposed inside the first tube part 2. Then, a first flow channel 4 through which the feed gas flows downward is formed in a space between the first tube part 2 and the second tube part 3, and a second flow channel 5 through which the feed gas flows upward is formed in a space inside the second tube part 3. For this reason, the side wall of the second tube part 3 becomes a partition wall that separates the first flow channel 4 and the second flow channel 5 from each other.

The first tube part 2 is formed in a circular tube shape having a bottom, and is formed uprightly in the vertical direction. The upper end of the first tube part 2 is provided with an inlet 6 through which the feed gas flows into the first flow channel 4.

The second tube part 3 is formed in a circular tube shape and having a diameter smaller than the first tube part 2, and is formed uprightly in the vertical direction. Then, since the second tube part 3 is supported by a support member that extends from the inner wall of the first tube part 2, a gap between the first tube part 2 and the second tube part 3 is maintained uniformly so that the first tube part 2 and the second tube part 3 are concentric with each other.

The lower end of the second tube part 3 is separated from the bottom surface of the first tube part 2, and the lower end surface of the second tube part 3 is provided with an opening 7 which causes the first flow channel 4 to be connected to the second flow channel 5. That is, the second flow channel 5 is connected to the lower portion of the first flow channel 4 through the opening 7. For this reason, the feed gas which flows from the inlet 6 into the first flow channel 4 moves down to the bottom of the first tube part 2 along the first flow channel 4, flows from the opening 7 formed in the lower end surface of the second tube part 3 into the second flow channel 5, and moves upward to the upper portion of the second tube part 3 along the second flow channel 5.

A distributor 8 which holds the catalyst carrying support medium and through which the feed gas passes is attached to the second flow channel 5 of the second tube part 3.

The distributor 8 is formed as a grating provided with a plurality of holes.

The diameter of the hole formed in the distributor 8 is smaller than the particle diameter (the diameter) of the catalyst carrying support medium. In general, the catalyst carrying support medium is formed so that the average particle diameter is in the range of 0.1 mm to 1.0 min. For this reason, the diameter of the hole formed in the distributor 8 may be in the range of 0.05 mm to 0.80 mm. In this case, the diameter of the hole formed in the distributor 8 is desirably in the range of 0.1 mm to 0.6 mm, and is more desirably in the range of 0.2 mm to 0.4 mm. When the diameter of the hole formed in the distributor 8 is set to 0.05 mm or more, the pressure loss of the feed gas passing through the distributor 8 may be decreased. Then, this effect may be further improved when the diameter is set to 0.1 mm or more or 0.2 min or more. Meanwhile, when the diameter of the hole formed in the distributor 8 is set to 0.8 mm or less, it is possible to suppress the catalyst carrying support medium from being dropped out of the distributor 8. Then, this effect may be further improved when the diameter is set to 0.6 mm or less or 0.4 mm or less.

Further, the gap between the holes formed in the distributor 8 is not particularly limited, but may be set, for example, in the range of 0.1 mm to 4.0 mm. In this case, the gap between the holes formed in the distributor 8 is desirably in the range of 0.2 mm to 2.0 mm, and is more desirably in the range of 0.4 mm to 1.0 mm. When the gap between the holes faulted in the distributor 8 is set to 0.1 mm or more, the machining workability of the distributor 8 is improved, and hence the mechanical strength may be improved. Then, this effect may be further improved when the diameter is set to 0.2 mm or more or 0.4 mm or more. Meanwhile, when the gap between the holes formed in the distributor 8 is set to 4.0 mm or less, the feed gas may be uniformly supplied, and hence the uniformity in fluidization may be improved. Then, this effect may be further improved when the diameter is set to 2 mm or less or 1 mm or less.

The attachment position of the distributor 8 is not particularly limited, but it is desirable that the attachment position be set as low as possible from the viewpoint of ensuring the reaction area. For example, the attachment position may be set to the opening 7 as the lower end of the second flow channel 5 or the vicinity of the opening 7.

The second tube part 3 extends to a position higher than the upper end of the first tube part 2, and an enlarged tube part 9 having an enlarged diameter is formed at the upper position in relation to the upper end of the first tube part 2. Then, the upper end surface of the second tube part 3 is provided with an outlet 10 through which the feed gas is discharged. Furthermore, the upper end of the first tube part 2 is bonded to the second tube part 3 so as to be closed.

Then, the first tube part 2 and the second tube part 3 are formed so that a section from the lower ends thereof to a predetermined height position becomes a heating part 11, and a heating device (not illustrated) is disposed around the heating part 11 so as to heat the heating part 11 while covering the first tube part 2 and the second tube part 3.

The heating part 11 is a part that heats the feed gas and circulates the feed gas on the catalyst canying support medium held by the distributor 8 so that the carbon nanotube is synthesized on the catalyst carrying support medium. For this reason, it is desirable to set the heating part 11 so that the heating part is located below the inlet 6 and includes a fluid area as a range in which the catalyst carrying support medium flows when the feed gas is supplied.

The heating device heats the heating part 11 for the first tube part 2 and the second tube part 3 so as to preheat the feed gas flowing through the first flow channel 4 and to heat or warm the feed gas flowing through the second flow channel 5. Therefore, since the first tube part 2 is covered by the heating device, the first flow channel 4 is disposed at a position where the preheating of the feed gas caused by the heat exchange with the heating device and the second flow channel 5 is promoted. As the heating device, any heating device may be used as long as the heating part 11 may be heated. For example, an electric furnace which covers the first tube part 2 may be used.

The materials of the first tube part 2 and the second tube part 3 are not particularly limited as long as the materials are heat-resistant. However, it is desirable to use a transparent material such as quartz from the viewpoint of heating the catalyst carrying support medium by using the radiant heat from the heating device.

Next, the synthesis of the carbon nanotube using the heat exchanger type reaction tube 1 according to the embodiment will be described.

First, the catalyst carrying support medium is input from the outlet 10 into the second tube part 3. Then, since the input catalyst carrying support medium is held by the distributor 8, the catalyst carrying support medium is charged in the second tube part 3.

Next, the feed gas is supplied from the inlet 6 to the first flow channel 4 while the heating part 11 for the first tube part 2 and the second tube part 3 is heated by the heating device. Then, the feed gas which is supplied to the first flow channel 4 moves down to the bottom of the first tube part 2 along the first flow channel 4 while being heated to be preheated in the heating part 11. The feed gas which moves down to the bottom of the first tube part 2 flows from the opening 7 formed in the lower end surface of the second tube part 3 into the second flow channel 5. The feed gas which flows into the second flow channel 5 passes through the distributor 8, and moves up in the second tube part 3 along the second flow channel 5 while fluidizing the catalyst carrying support medium. Accordingly, the feed gas is circulated on the catalyst carrying support medium, and hence the carbon nanotube is synthesized onto the catalyst carrying support medium.

Here, the feed gas is sufficiently heated at the time point in which the feed gas flows into the second flow channel 5 in that the feed gas is preheated in the first flow channel 4, and the periphery of the second tube part 3 is covered by the first tube part 2 and the heating device. For this reason, the feed gas which flows up in the second flow channel 5 may be maintained at a high temperature while not being cooled, and hence the temperature from the upstream side to the downstream side becomes uniform. Accordingly, since the feed gas having high heat uniformity is circulated on the catalyst carrying support medium, the carbon nanotube is effectively synthesized on the catalyst carrying support medium.

Meanwhile, the upper portion of the second tube part 3 as the outlet side of the second flow channel 5 contacts the upper portion of the first tube part 2 as the inlet side of the first flow channel 4 in which the feed gas is not sufficiently heated. For this reason, a heat exchange operation is performed such that the high-temperature reacted feed gas which flows out of the second flow channel 5 of the second tube part 3 is cooled by the low-temperature feed gas flowing into the first flow channel 4 of the first tube part 2 and the low-temperature feed gas which flows into the first flow channel 4 of the first tube part 2 is heated by the high-temperature reacted feed gas flowing out of the second flow channel 5 of the second tube part 3. Accordingly, since most of energy necessary for heating the feed gas flowing into the first flow channel 4 of the first tube part 2 may be obtained from the reacted feed gas flowing out of the second flow channel 5 of the second tube part 3, the energy input to the heating device may be reduced, and the cooling of the reacted feed gas flowing out of the second flow channel 5 of the second tube part 3 may be also simplified.

Further, since the first tube part 2 and the second tube part 3 are formed of transparent quartz, the catalyst carrying support medium is heated by the radiant heat from the heating device. Accordingly, since a change in the temperature of the feed gas flowing through the second flow channel 5 is suppressed, the heat uniformity of the feed gas flowing through the second flow channel 5 may be further improved.

Further, since the first flow channel 4 and the second flow channel 5 are adjacent to each other and the feed gas is preheated in the first flow channel 4, the heat exchanger type reaction tube 1 may be provided in a compact size.

Then, the feed gas which has been circulated on the catalyst carrying support medium is discharged from the outlet 10 formed in the upper end surface of the second tube part 3. At this time, since the upper portion of the second tube part 3 is provided with the enlarged tube part 9 having an enlarged diameter, the upward movement speed of the feed gas which has been circulated on the catalyst carrying support medium in the enlarged tube part 9 decreases. Accordingly, it is possible to prevent the catalyst carrying support medium from flying out of the outlet 10 by causing the catalyst carrying support medium which moves upward along with the stream of the feed gas to move down in the enlarged tube part 9.

[Second Embodiment]

Next, a second embodiment of the invention will be described.

The second embodiment is basically the same as the first embodiment, but is different from the first embodiment only in that the heat exchanger type reaction tube is provided with a third tube part. For this reason, in the description below, only the different point from the first embodiment will be described, and the same point as the first embodiment will not be presented.

A heat exchanger type reaction tube according to the second embodiment generates a granular catalyst carrying support medium by carrying carbon nanotube synthesis catalysts on a support medium through the circulation of a catalyst source gas (a second gas) on the granular support medium and synthesizes the carbon nanotube on the catalyst carrying support medium through the circulation of a feed gas on the catalyst carrying support medium.

The catalyst source gas is a gas that carries a metallic catalyst for synthesizing the carbon nanotube on the support medium. For example, the catalyst source gas contains a carrier gas and a metal source forming the carbon nanotube synthesis catalysts.

As the metal source contained in the catalyst source gas, a gas containing metal used for synthesizing the carbon nanotube is generally desirable, and may contain one or more elements selected from V, Cr, Mn, Fe, Co, Ni, Cu, Zn, Mo, W, and Au. Among these examples, Fe, Co, and Ni having a large carbon solution amount are particularly desirable. Further, organic metal vapor such as metallocene is desirable.

As the carrier gas contained in the catalyst source gas, an inert gas such as argon and nitrogen is desirable. Further, hydrogen may be used as the carrier gas.

Figure 2:
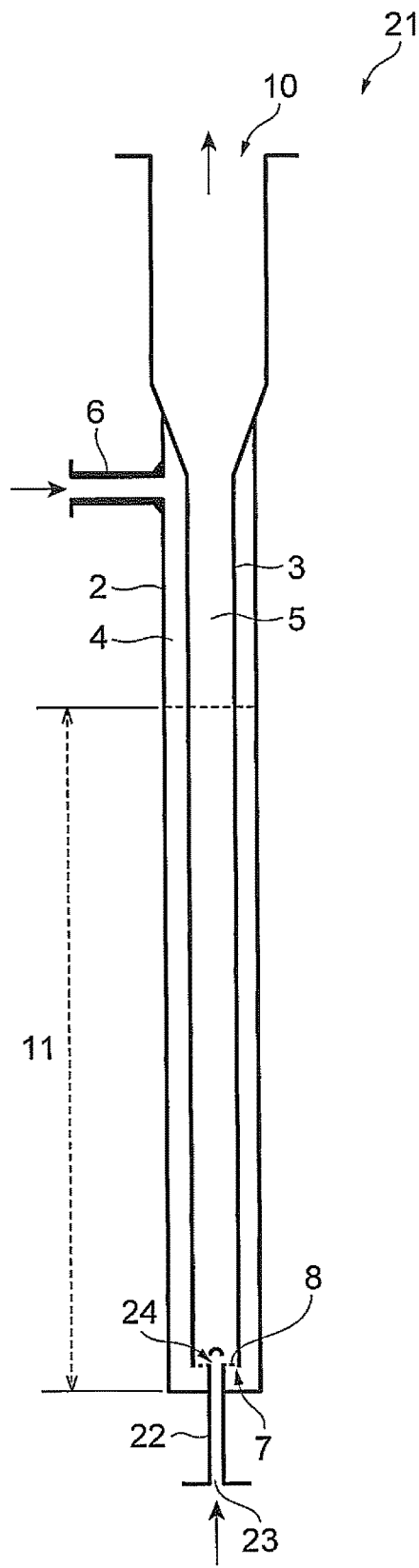
FIG. 2 is a schematic top view of a heat exchanger type reaction tube according to a second embodiment.

FIG. 2 is a schematic top view of a heat exchanger type reaction tube according to the second embodiment. As illustrated in FIG. 2, a heat exchanger type reaction tube 21 according to the second embodiment is provided with the first tube part 2 and the second tube part 3 which are formed as a double-tube structure and a third tube part 22 which penetrates the first tube part 2 and extends downward from the lower end of the second tube part 3. Then, a third flow channel 23 through which the catalyst source gas flows is formed in a space inside the third tube part 22, and the third flow channel 23 is connected to only the second flow channel 5 without communicating with the first flow channel 4.

The third tube part 22 is formed in a circular tube shape having a diameter smaller than the second tube part 3 and extends in the vertical direction. The upper end of the third tube part 22 is connected to the distributor 8 attached to the second flow channel 5 of the second tube part 3, and the third flow channel 23 extends from the distributor 8 toward the downside of the second flow channel 5. Then, the upper end surface of the third tube part 22 is provided with an opening 24 which causes the second flow channel 5 and the third flow channel 23 to be connected to each other. For this reason, the catalyst source gas which is supplied to the third flow channel 23 of the third tube part 22 moves up to the top of the third tube part 22 along the third flow channel 23, flows from the opening 24 into the second flow channel 5, and moves up to the upper portion of the second tube part 3 along the second flow channel 5. Furthermore, the third tube part 22 may or may not penetrate the distributor 8. However, it is desirable that the third tube part 22 penetrate the distributor 8 from the viewpoint of suppressing the catalyst source gas supplied from the third tube part 22 from being stuck to the distributor 8. Meanwhile, when the third tube part 22 does not penetrate the distributor 8, it is desirable that the opening 24 of the third tube part 22 be formed as one hole of the distributor 8 from the viewpoint of suppressing the catalyst source gas supplied from the third tube part 22 from being stuck to the distributor 8.

Further, the third tube part 22 is used to send the catalyst source gas flowing through the third flow channel 23 to the second flow channel 5 in a low-temperature state. Therefore, since only the heating part 11 for the first tube part 2 and the second tube part 3 is covered by the heating device, the third flow channel 23 is disposed at a position where the preheating of the catalyst source gas caused by the heat exchange with the heating device and the second flow channel 5 is suppressed.

Next, the synthesis of the carbon nanotube using the heat exchanger type reaction tube 21 according to the embodiment will be described.

First, the support medium is input from the outlet 10 into the second tube part 3. Then, since the input support medium is held by the distributor 8, the support medium is charged in the second tube part 3.

Next, the heating part 11 for the first tube part 2 and the second tube part 3 is heated by the heating device, the catalyst source gas is supplied to the third flow channel 23, and the feed gas is supplied from the inlet 6 to the first flow channel 4.

Then, the catalyst source gas which is supplied to the third flow channel 23 flows along the third flow channel 23 from the opening 24 formed in the upper end surface of the third tube part 22 into the second flow channel 5. Further, the feed gas which is supplied to the first flow channel 4 flows from the opening 7 formed in the lower end surface of the second tube part 3 into the second flow channel 5 while being heated to be preheated in the heating part 11. Then, the catalyst source gas and the feed gas which flow into the second flow channel 5 move up in the second tube part 3 along the second flow channel 5 while fluidizing the support medium. Accordingly, the catalyst source gas and the feed gas are circulated on the support medium, and hence the carbon nanotube synthesis catalysts are carried on the support medium. Furthermore, the supply of the catalyst source gas to the third flow channel 23 and the supply of the feed gas to the first flow channel 4 may be performed simultaneously or alternately. Alternatively, one of the catalyst source gas and the feed gas may be supplied intermittently.

Here, since the third flow channel 23 is connected to the second flow channel 5 without communicating with the first flow channel 4 and extends to the downstream side of the distributor 8, the catalyst source gas may be sent to the support medium in a low-temperature state so that the reaction thereof occurs on the high-temperature support medium. For this reason, even when a gas which is independently decomposed at a high temperature is used as the catalyst source gas, it is not until the catalyst source gas contacts with the high-temperature support medium at the second flow channel 5 that the catalyst source gas is decomposed without the decomposition of the catalyst source gas in the third flow channel 23, and hence a satisfactory reaction of the catalyst source gas occurs on the support medium. Accordingly, for example, when the carbon nanotube is synthesized by a CVD process, the catalyst may be carried on the support medium by causing the low-temperature catalyst source gas from the third flow channel 23 to contact the high-temperature support medium in the second flow channel 5. Further, the feed gas containing the high-temperature carbon source from the first flow channel 4 is decomposed by the catalyst on the high-temperature support medium. Thus, the carbon nanotube may be effectively synthesized.

Then, the catalyst source gas and the feed gas circulated on the support medium are discharged from the outlet 10 formed in the upper end surface of the second tube part 3. At this time, since the upper portion of the second tube part 3 is provided with the enlarged tube part 9 in which the diameter of the second flow channel 5 is enlarged, the upward movement speed of the catalyst source gas and the feed gas circulated on the support medium in the second flow channel 5 decreases. Accordingly, it is possible to prevent the support medium from flying out of the outlet 10 by causing the support medium which moves upward along with the stream of the catalyst source gas and the feed gas to move down in the enlarged tube part 9.

While the preferred embodiments of the invention have been described, the invention is not limited to the above-described embodiments.

For example, in the above-described embodiments, an example has been described in which the heat exchanger type reaction tube according to the invention is applied as the heat exchanger type reaction tube used for synthesizing the carbon nanotube, but the heat exchanger type reaction tube according to the invention is not limited thereto. That is, the heat exchanger type reaction tube according to the invention may be used as various reaction tubes. In this case, the first gas, the second gas, and the fluidization medium may be appropriately set in response to the use purpose of the heat exchanger type reaction tube.

Figure 3:
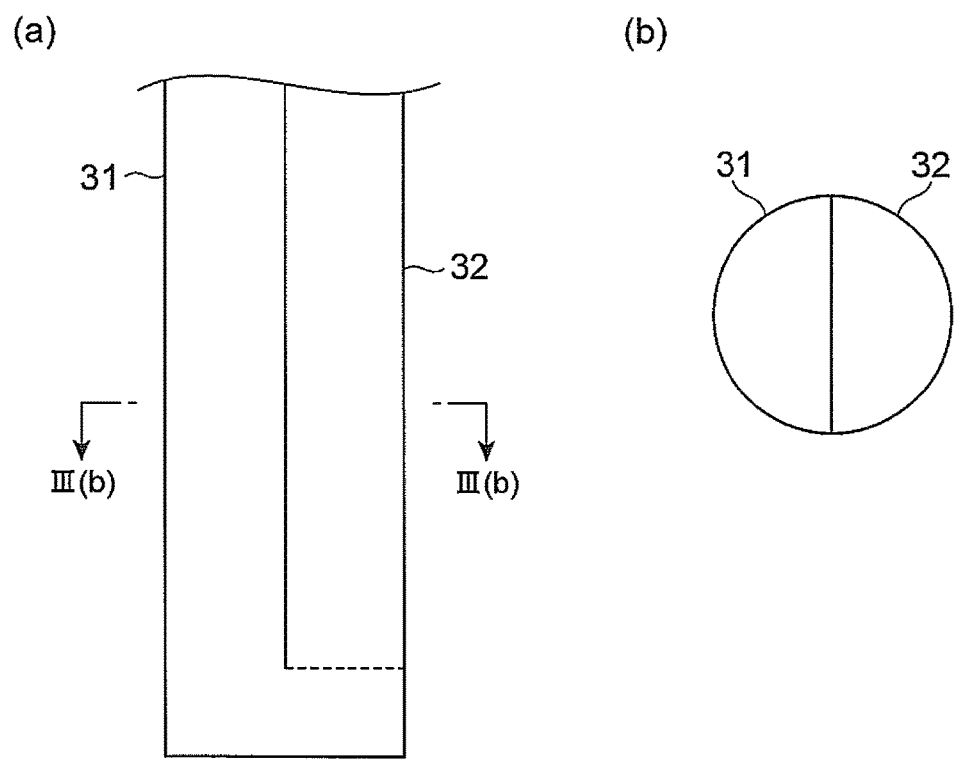
FIG. 3 is a schematic view of a heat exchanger type reaction tube of a modified example, where
Figure 4:
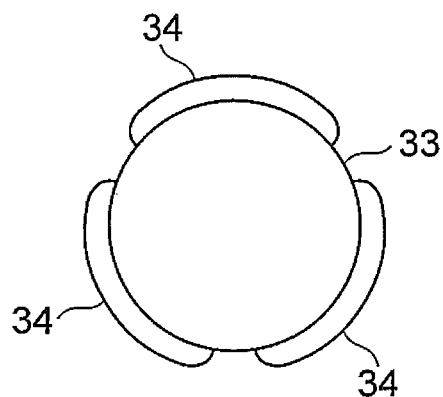
FIG. 4 is a schematic cross-sectional view of a heat exchanger type reaction tube of a modified example.

Further, in the above-described embodiments, an example has been described in which the first tube part and the second tube part are formed as a double-tube structure. However, when the first flow channel and the second flow channel are adjacent to each other while being separated by a partition wall, the first tube part and the second tube part may have any relation. Further, the first tube part and the second tube part may be formed in a structure in which the first tube part is disposed at the outside of the second tube part. For example, as illustrated in FIG. 3, a structure may be employed in which the first tube part 31 and the second tube part 32 as single tube parts are connected to each other in parallel. Further, as illustrated in FIG. 4, a structure may be employed in which first tube parts 34 which are branched into a plurality of parts are connected to the periphery of a second tube part 33. FIG. 3 is a schematic view of a heat exchanger type reaction tube of a modified example, where FIG. 3(a) is a schematic front view and FIG. 3(b) is a cross-sectional view taken along the line III(b)-III(b) of FIG. 3(a). FIG. 4 is a schematic cross-sectional view of a heat exchanger type reaction tube of a modified example. In such a case, the ratio in which the periphery of the second tube part is covered by the first tube part is desirably 30% or more, more desirably 50% or more, and further desirably 70% or more. When the ratio is set to 30% or more, a variation in the temperature of the second tube part is suppressed, and hence the heat uniformity of the gas flowing through the second flow channel may be improved. Then, when the ratio is set to 50% or more or 70% or more, this effect may be further improved.

Figure 26:
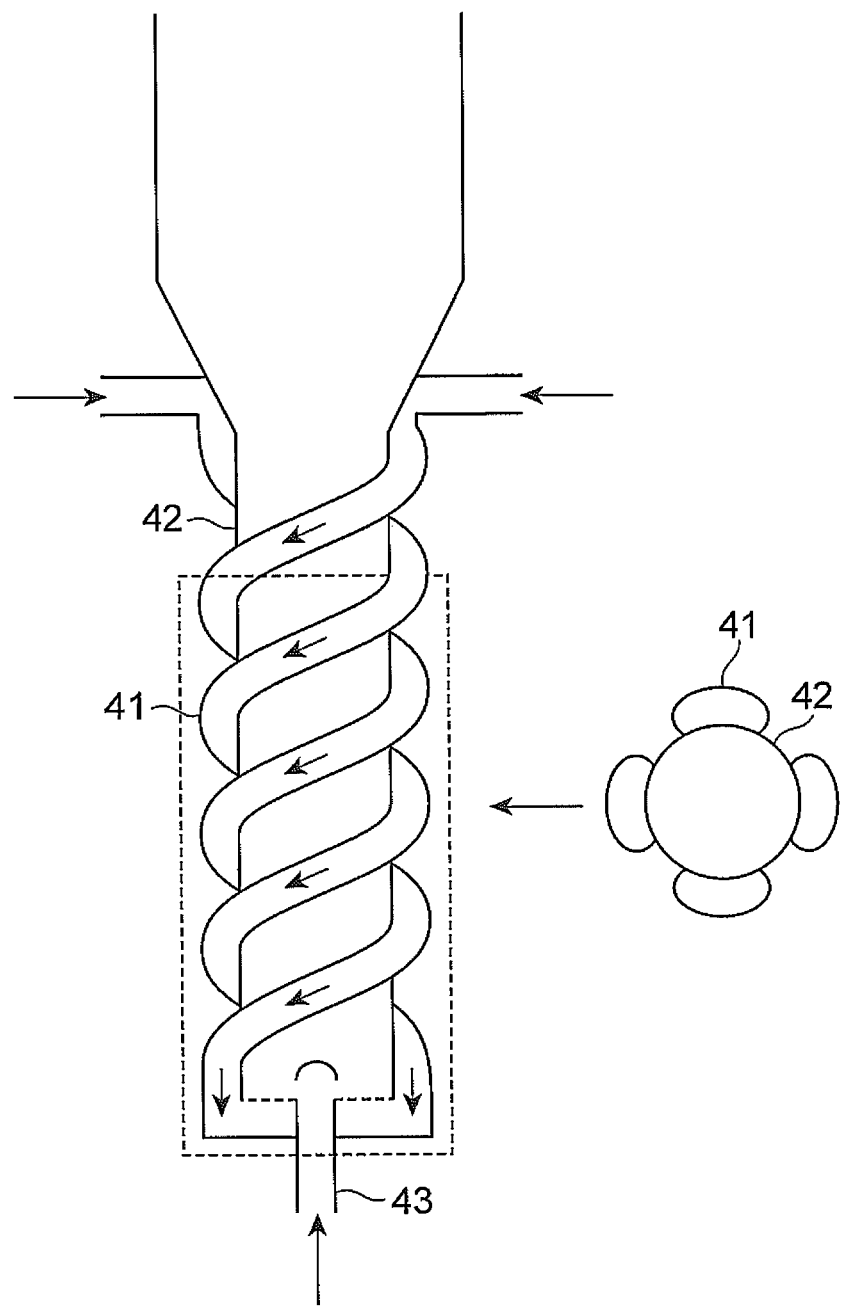
FIG. 26 is a schematic view of the heat exchanger type reaction tube of the modified example.
Figure 27:
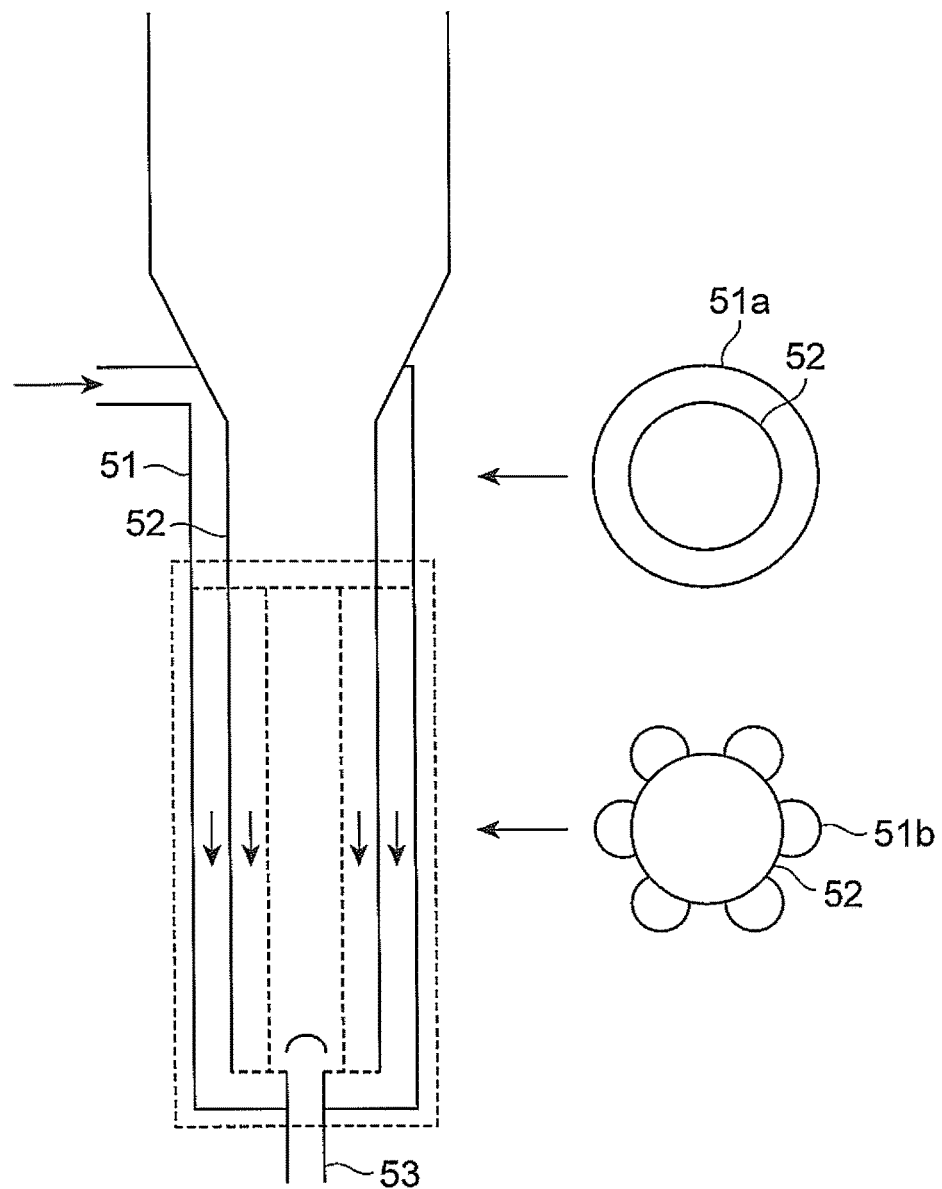
FIG. 27 is a schematic view of the heat exchanger type reaction tube of the modified example.

Further, when the third flow channel is used as in the second embodiment, the second flow channel is cooled by the second gas flowing from the third flow channel. For this reason, the second tube part may be exposed from the first tube part so that the second tube part forming the second flow channel may be directly heated. For example, as illustrated in FIG. 26, a structure may be employed in which a third tube part 43 is connected to a lower end of a second tube part 42 and one or plural first tube parts 41 are wound on the second tube part 42 in a spiral shape. Accordingly, since the first tube part 41 is provided with a gap from which the second tube part 42 is exposed, the second tube part 42 may be directly heated. Moreover, since a fluid flowing through the second tube part 42 essentially flows across the first tube part 41, a heat may be effectively exchanged. Further, as illustrated in FIG. 27, a structure may be employed in which a third tube part 53 is connected to a lower end of a second tube part 52, an upper portion 51a of a first tube part 51 is formed as a single tube, and a heating part 51b for the first tube part 51 is branched into a plurality of parts. Accordingly, since a gap from which the second tube part 52 is exposed is formed in the heating part 51b of the first tube part 51, the second tube part 52 may be directly heated. Moreover, since the upper portion 51a of the first tube part 51 is formed as a single tube above the heating part 51b, the first flow channel contacts the entire surface of the second tube part 52, and hence a heat exchange operation may be effectively performed. Furthermore, such a structure in which the second tube part is exposed from the first tube part may be also applied to a case where the third flow channel is not used as in the first embodiment.

Further, in the above-described embodiments, an example has been described in which the first tube part is formed vertically, but the first tube part may be formed in any shape as long as the first gas may be moved down while being adjacent to the second flow channel. For example, a shape may be employed in which the first gas moves down in a spiral shape as in the first tube part 41 illustrated in FIG. 26.

EXAMPLES

Next, examples of the invention will be described, but the invention is not limited to the examples below.

First Comparative Example

Figure 5:
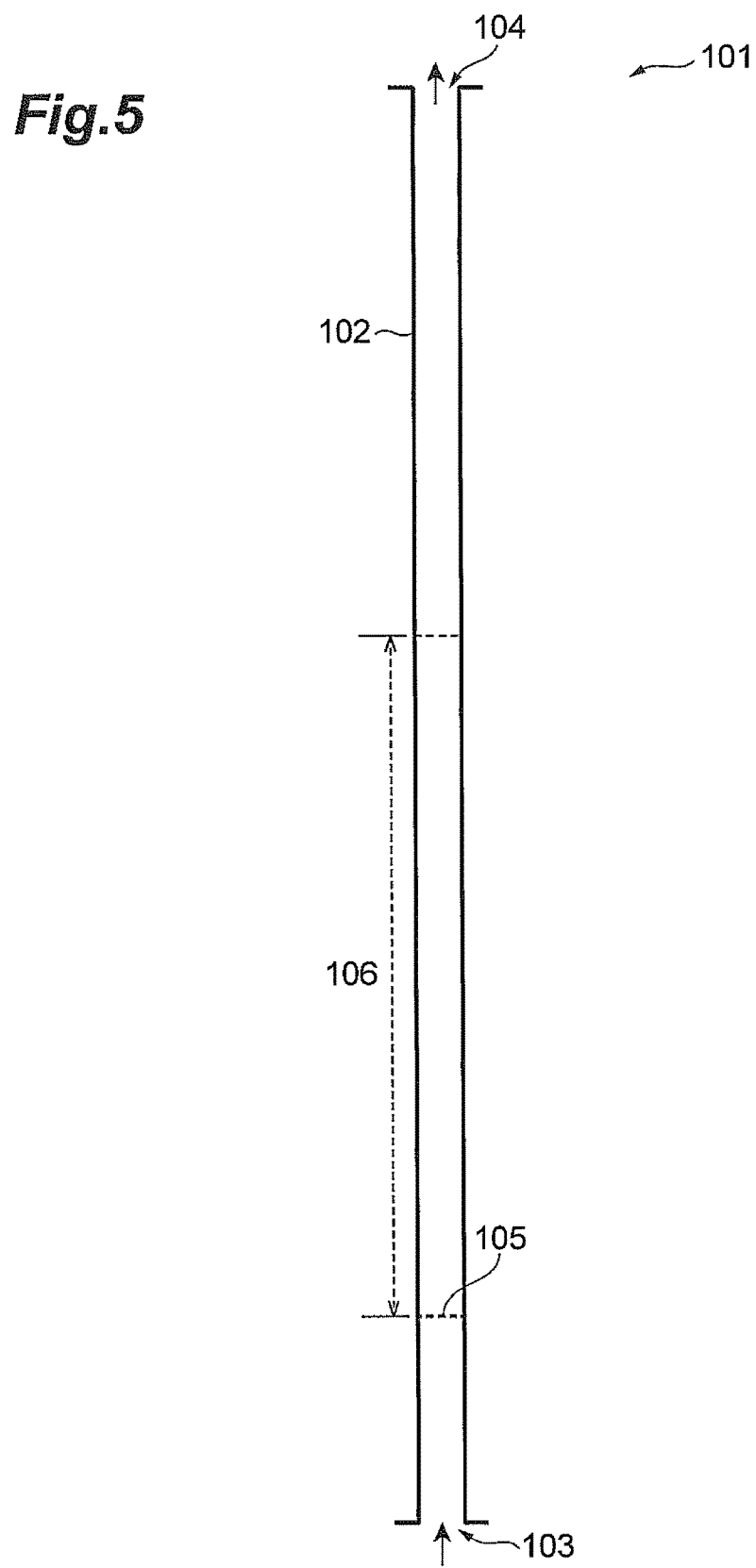
FIG. 5 is a schematic top view of a reaction tube of a first comparative example.

A reaction tube 101 illustrated in FIG. 5 was used as the reaction tube. The reaction tube 101 was formed by a straight tube part 102 which extends straightly, the lower end thereof was provided with an inlet 103 for supplying the feed gas, and the upper end thereof was provided with an outlet 104 for discharging the feed gas. A distributor provided with penetration holes was disposed inside the straight tube part 102. A section from the lower end of the straight tube part 102 to a predetermined height position was set as a heating part 106, and a heating device (not illustrated) for heating the heating part 106 was disposed around the heating part 106.

Then, the granular catalyst carrying support medium was input from the outlet 104, the heating part 106 was heated by the heating device, and the feed gas was supplied from the inlet 103, so that the carbon nanotube was synthesized. The total flow rate of the feed gas was set to 3.16 slm (standard liter/min). As the configuration of the feed gas, $C_2H_2$ of 0.3 vol %, $H_2$ of 10 vol %, and $H_2O$ of 50 ppmv (parts per million volume) were used, and Ar was used as an atmosphere gas. The temperature of the heating device was set to 800° C., and the reaction time was set to 10 minutes.

Figure 6:
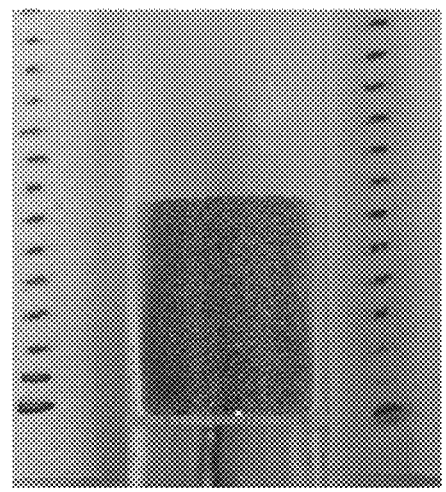
FIG. 6 is a picture of the reaction tube of the first comparative example, where
Figure 6:
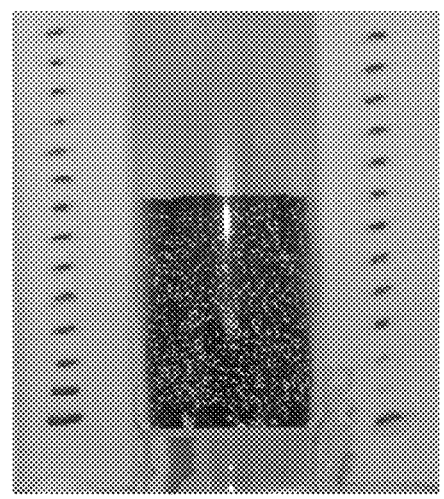

FIG. 6 is a picture of a reaction tube of a first comparative example, where FIG. 6(a) is a picture of the reaction tube having a non-synthetic carbon nanotube and FIG. 6(b) is a picture of the reaction tube having a synthetic carbon nanotube.

First Example

The heat exchanger type reaction tube 1 illustrated in FIG. 1 was used as the reaction tube. The heating part 11 was heated by the heating device, the granular catalyst carrying support medium was input into the second flow channel 5, and the feed gas was supplied from the inlet 6, so that the carbon nanotube was synthesized. The total flow rate of the feed gas was set to 2.70 slm. As the configuration of the feed gas, $C_2H_2$ of 0.3 vol %, $H_2$ of 10 vol %, and $H_2O$ of 50 ppmv were used, and Ar was used as an atmosphere gas. The temperature of the heating device was set to 800° C., and the reaction time was set to 10 minutes.

Furthermore, in the heat exchanger type reaction tube 1, the inside diameter (the outer shape of the second flow channel 5) of the second tube part 3 charged with the catalyst carrying support medium is smaller than that of the straight tube part 102 of the first comparative example. For this reason, the linear flow rate of the feed gas was adjusted to be equal to that of the first comparative example.

Figure 7:
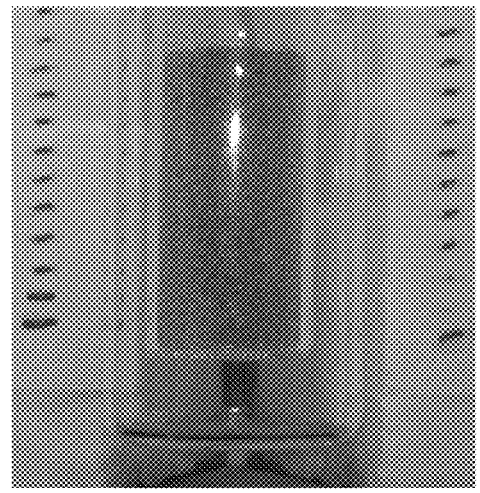
FIG. 7 is a picture of a heat exchanger type reaction tube of a first example, where
Figure 7:
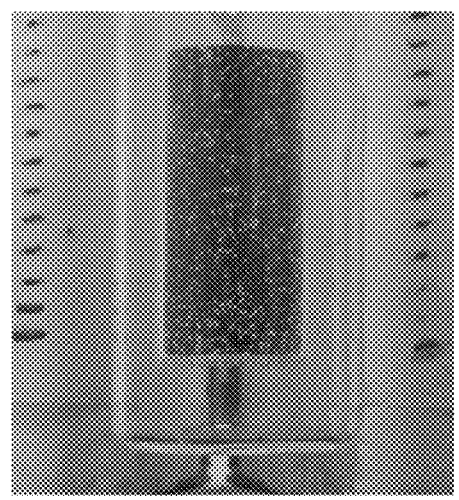

FIG. 7 is a picture of the heat exchanger type reaction tube of the first example. FIG. 7(a) is a picture of the heat exchanger type reaction tube having a non-synthetic carbon nanotube and FIG. 7(b) is a picture of the heat exchanger type reaction tube having a synthetic carbon nanotube.

[Observation of Carbon Nanotube]

Figure 8:
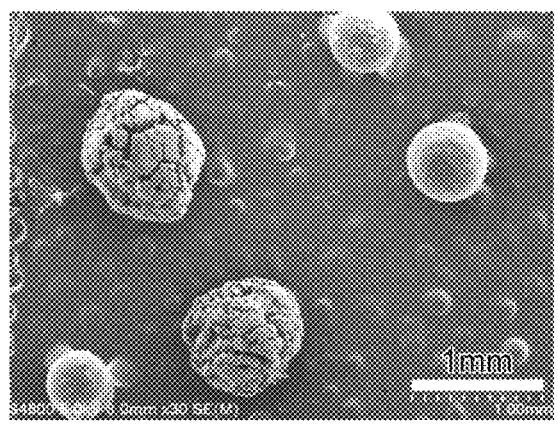
FIG. 8 is a SEM image of the first comparative example.
Figure 8:
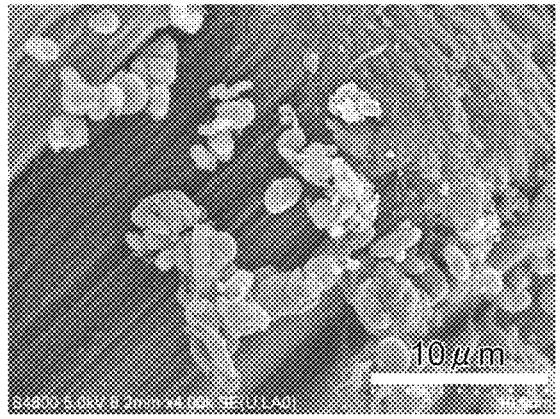
Figure 8:
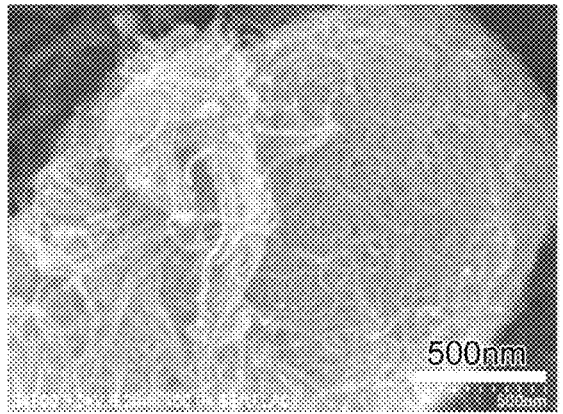
Figure 9:
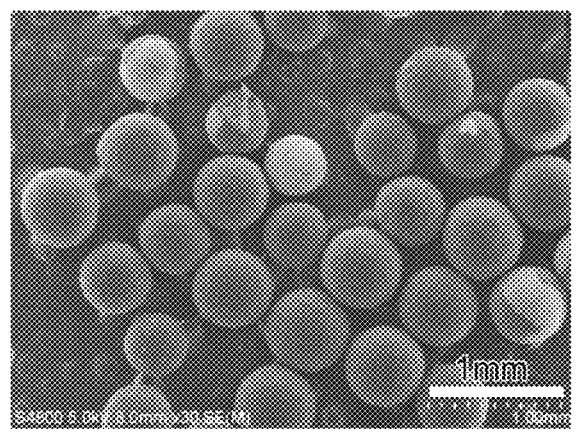
FIG. 9 is a SEM image of the first example.
Figure 9:
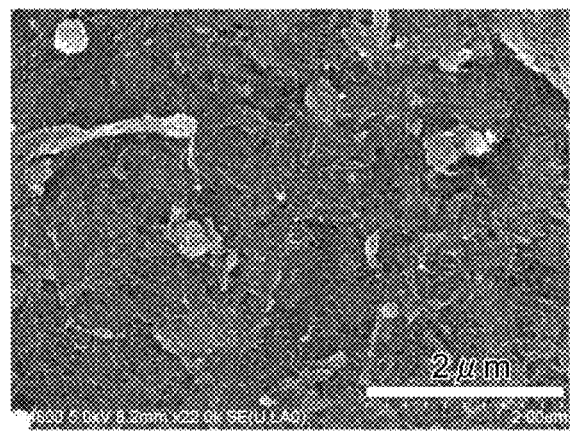
Figure 9:
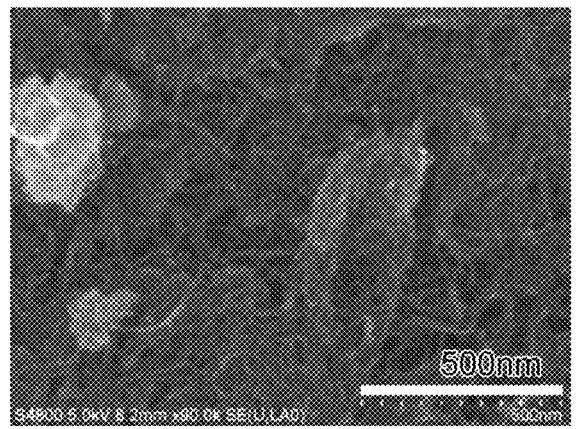

The result obtained by observing the carbon nanotube synthesized by the reaction tube 101 of the first comparative example and the heat exchanger type reaction tube 1 of the first example using a scanning electron microscope (SEM) (S-4800 manufactured by Hitachi, Ltd.) are illustrated in FIGS. 8 and 9. FIG. 8 is a SEM image of the first comparative example. FIG. 9 is a SEM image of the first example.

As illustrated in FIG. 8, in the first comparative example, the carbon nanotube was grown vertically from the catalyst carrying support medium at the upper layer in the distributor 105, but the carbon nanotube was not grown from the catalyst carrying support medium at the intermediate layer or less in the distributor 105.

Meanwhile, as illustrated in FIG. 9, in the first example, the carbon nanotube was uniformly grown from the entire catalyst carrying support medium in the distributor 8. Further, the grown carbon nanotube formed a felt, film.

[Raman Measurement]

Figure 10:
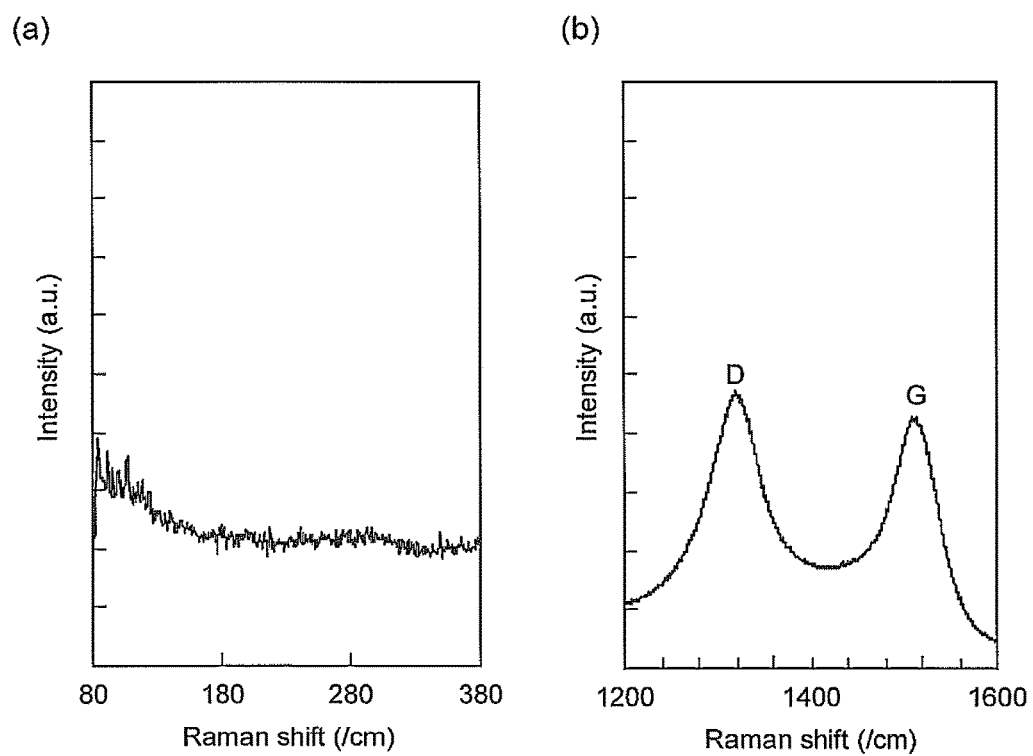
FIG. 10 is a Raman spectrum of the carbon nanotube of the first comparative example.
Figure 11:
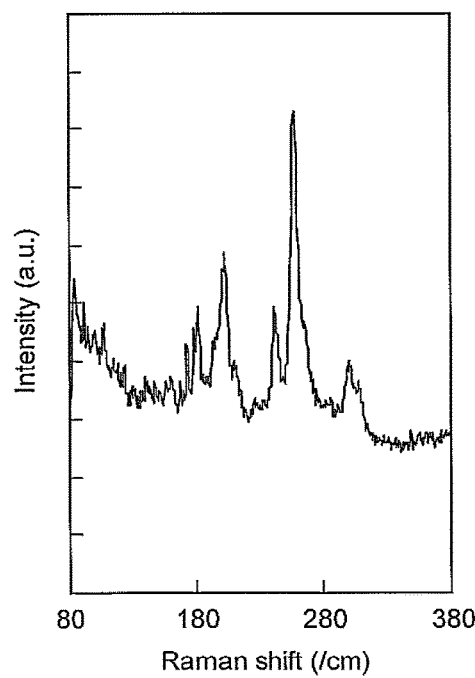
FIG. 11 is a Raman spectrum of the carbon nanotube of the first example
Figure 11:
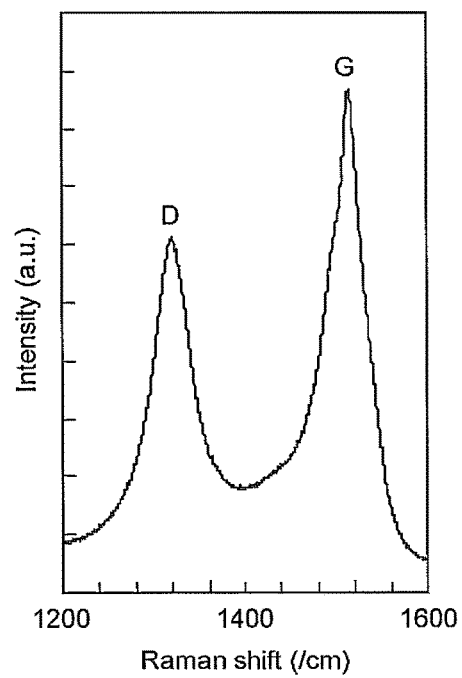

According to a Raman spectroscopy using a Raman Spectrometer (HR-800 manufactured by HORIBA, Ltd.), the carbon nanotube synthesized by the reaction tube 101 of the first comparative example and the heat exchanger type reaction tube 1 of the first example was evaluated. The measurement wavelength was set to 488 nm. The measurement result is illustrated in FIGS. 10 and 11. FIG. 10 is a Raman spectrum of the carbon nanotube of the first comparative example. FIG. 11 is a Raman spectrum of the carbon nanotube of the first example.

As illustrated in FIG. 10(a), since a radial breathing mode (RBM) was not observed in the first comparative example, it was proved that the carbon nanotube synthesized by the reaction tube 101 of the first comparative example did not include a single-layer carbon nanotube.

Meanwhile, as illustrated in FIG. 11(a), since a radial breathing mode (RBM) was observed in the first example, it was proved that the carbon nanotube synthesized by the heat exchanger type reaction tube 1 of the first example includes a single-layer carbon nanotube.

Further, as illustrated in FIG. 10(b), in the first comparative example, a G-band caused by a graphite structure in the vicinity of 1590 [cm$^{-1}$] and a D-band caused by a crystal fault in the vicinity of 1340 [cm$^{-1}$] were observed. However, since the ratio G/D that represents crystalline was small, it was found that the quality of the carbon nanotube was low.

Meanwhile, as illustrated in FIG. 11(b), even in the first example, the G-band and the D-band were observed. Moreover, since the ratio G/D that represents crystalline was large, it was found that the quality of the carbon nanotube was high.

Second Comparative Example

The temperature distribution obtained when using the reaction tube 101 illustrated in FIG. 5 as the reaction tube was analyzed by Fluent. As the analysis condition, the inside diameter i.d. of the straight tube part 102 was set to 22 mm, the length of the heating part 106 was set to 300 mm, the outer surface of the heating part 106 was set to 820° C., and the outer surface other than the heating part 106 was set to 27° C. Further, the flow rate of the first gas supplied to the inlet 103 was changed so that the total flow rate of the first gas supplied to the inlet 103 was set to 3.16 slm, 5.00 slm, 10.00 slm, and 31.60 slm. The reaction tube 101 did not include the fluidization medium, and only the temperature distribution of the gas stream was evaluated.

Figure 12:
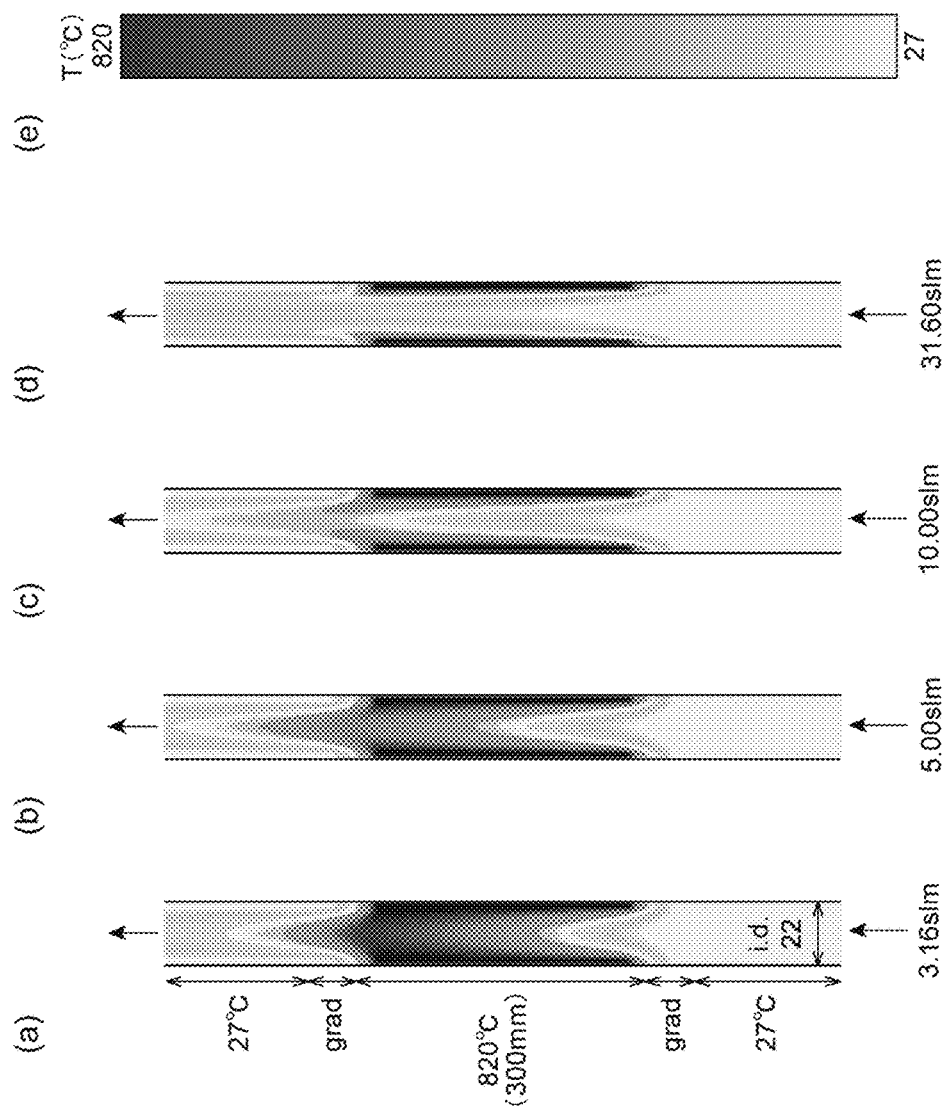
FIG. 12 is a diagram illustrating a temperature distribution analysis result of a second comparative example.

The analysis result is illustrated in FIG. 12. FIG. 12(a) illustrates a case where the total flow rate of the first gas is set to 3.16 slm, FIG. 12(b) illustrates a case where the total flow rate of the first gas is set to 5.00 slm, FIG. 12(c) illustrates a case where the total flow rate of the first gas is set to 10.00 slm, and FIG. 12(d) illustrates a case where the total flow rate of the first gas is set to 31.60 slm. Further, FIG. 12(e) illustrates the temperature gradation in FIGS. 12(a) to 12(d).

As illustrated in FIG. 12, in the second comparative example, the temperature of the lower portion of the heating part 106 did not increase sufficiently. For this reason, the carbon nanotube was not sufficiently synthesized in the lower portion of the heating part 106. Especially, as understood from FIGS. 12(a) to 12(d), an area in which the temperature does not rise sufficiently increases as the flow rate of the first gas increases.

Second Example

The temperature distribution obtained when using the heat exchanger type reaction tube 1 illustrated in FIG. 1 as the reaction tube was analyzed by Fluent. As the analysis condition, the inside diameter of the first tube part 2 (the outside diameter of the first flow channel 4) was set to 35 mm, the inside diameter of the second tube part 3 (the outside diameter of the second flow channel 5) was set to 22 mm, the length of the heating part 11 was set to 300 mm, the distance from the bottom surface of the first tube part 2 to the distributor 8 was set to 10 mm, the outer surface of the heating part 11 was set to 820° C., and the outer surface other than the heating part 11 was set to 27° C. Further, the flow rate of the first gas supplied to the inlet 6 was changed so that the total flow rate of the first gas supplied to the inlet 6 was set to 3.16 slm and 31.60 slm. The second tube part 3 did not include the fluidization medium, and only the temperature distribution of the gas stream was evaluated.

Figure 13:
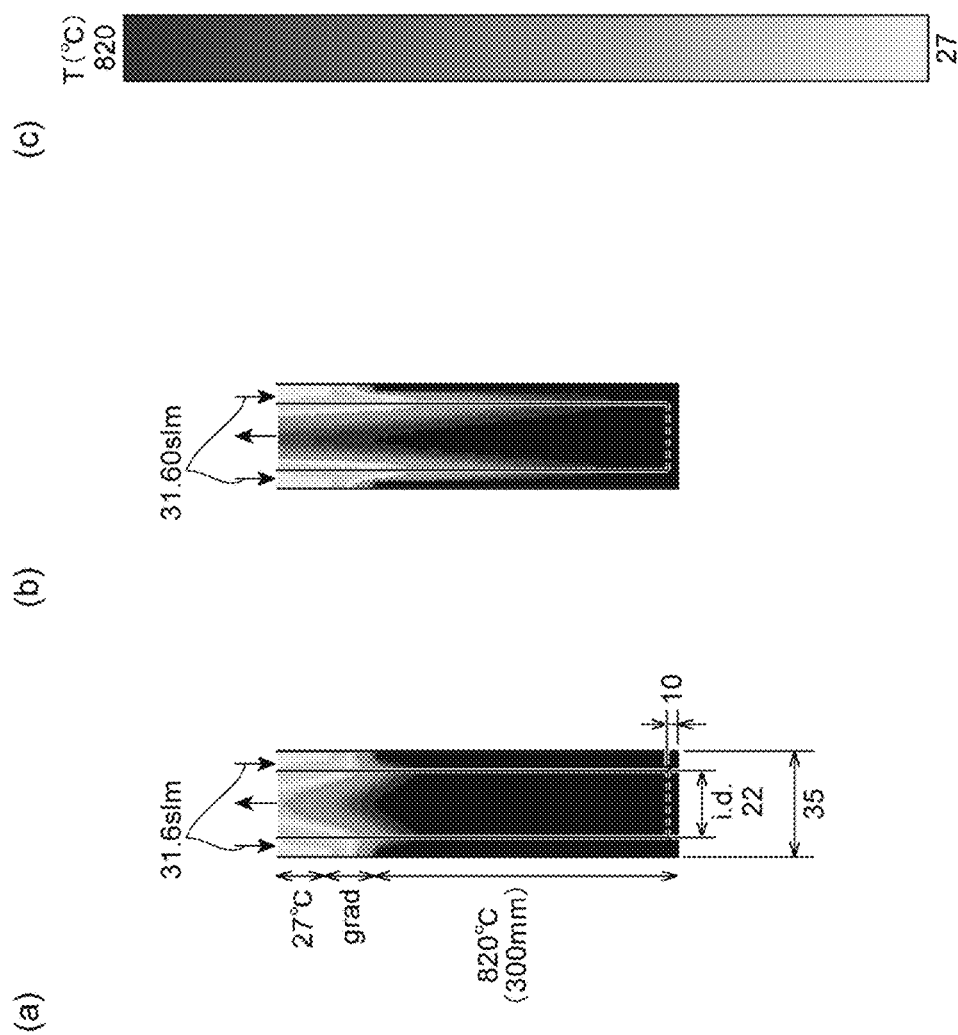
FIG. 13 is a diagram illustrating a temperature distribution analysis result of a second example.

The analysis result is illustrated in FIG. 13. FIG. 13(*a*) illustrates a case where the total flow rate of the first gas is set to 3.16 slm and FIG. 13(*b*) illustrates a case where the total flow rate of the first gas is set to 31.60 slm. Further, FIG. 13(*c*) illustrates the temperature gradation in FIGS. 13(*a*) and 13(*b*).

As illustrated in FIG. 13, in the second example, since the first gas was preheated when moving down in the first flow channel 4 of the first tube part 2, the temperature of the first gas reached a sufficient temperature at the time point in which the first gas flew into the second flow channel 5 of the second tube part 3. For this reason, the first gas flowing through the second flow channel 5 has a uniform temperature from the lower side of the second flow channel 5 to the upper side thereof. Further, when FIGS. 13(*a*) and 13(*b*) are compared, the distance until the temperature of the first gas rises to a sufficient temperature increases as the flow rate of the first gas increases. However, even when the total flow rate of the first gas was set to 31.60 slm by increasing the flow rate of the first gas, the temperature reached a sufficient temperature at the time point in which the first gas flew into the second flow channel 5 of the second tube part 3.

Third Example

The temperature distribution obtained when using the heat exchanger type reaction tube 21 illustrated in FIG. 2 as the reaction tube was analyzed by Fluent. As the analysis condition, the inside diameter of the first tube part 2 (the outside diameter of the first flow channel 4) was set to 35 mm, the inside diameter of the second tube part 3 (the outside diameter of the second flow channel 5) was set to 22 mm, the inside diameter of the third tube part 22 (the outside diameter of the third flow channel 23) was set to 2 mm, the length of the heating part 11 was set to 300 mm, the distance from the bottom surface of the first tube part 2 to the distributor 8 was set to 10 mm, the outer surface of the heating part 11 was set to 820° C., and the outer surface other than the heating part 11 was set to 27° C. Further, the flow rate of the first gas supplied to the inlet 6 was changed so that the total flow rate of the first gas supplied to the inlet 6 was set to 2.16 slm, 4.00 slm, and 9.00 slm. The flow rate of the second gas supplied to the third flow channel 23 was set to be the same so that the total amount of the second gas supplied to the third flow channel 23 was set to 1.00 slm. The second tube part 3 did not include the fluidization medium, and only the temperature distribution of the gas stream was evaluated.

Figure 14:
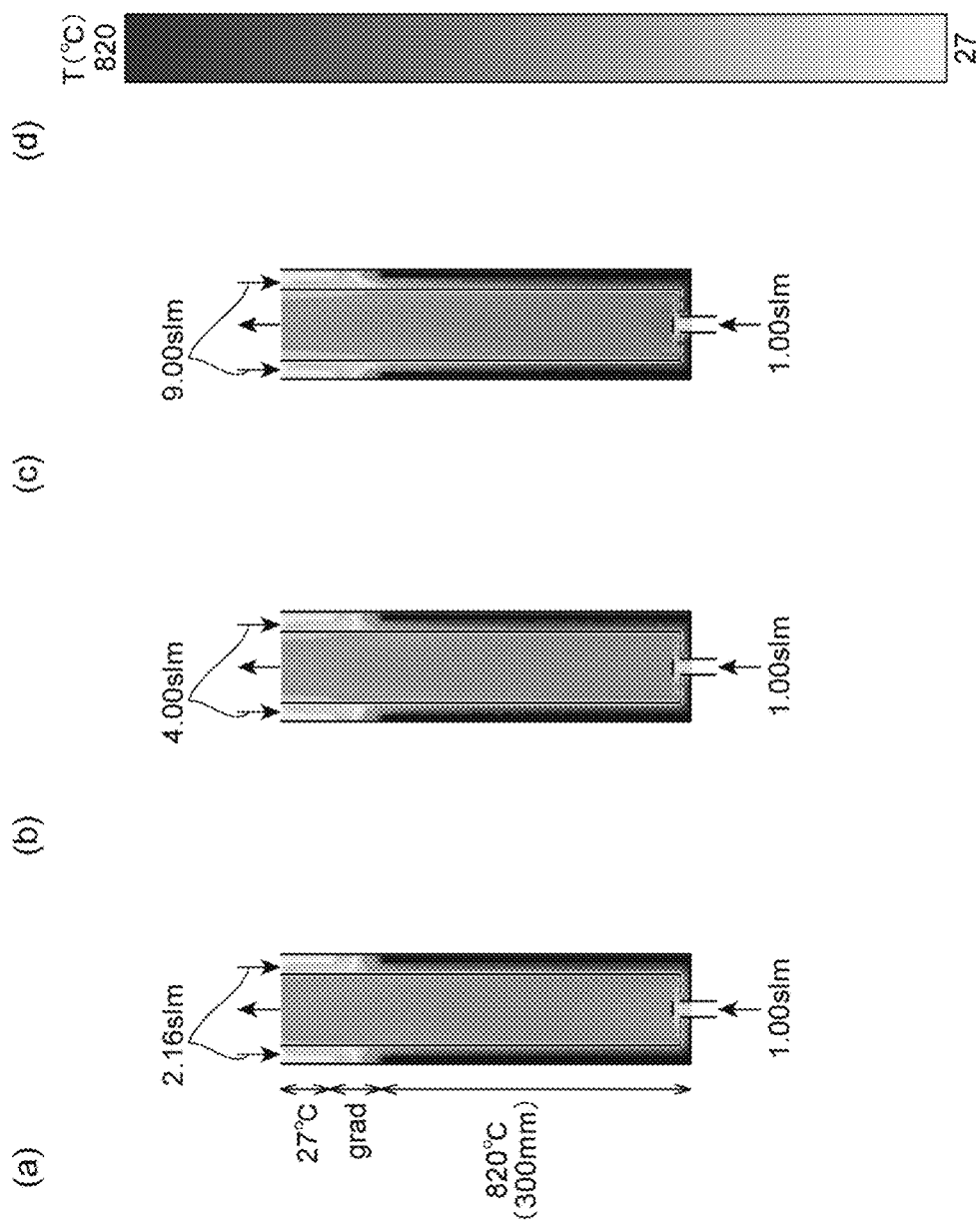
FIG. 14 is a diagram illustrating a temperature distribution analysis result of a third example.

The analysis result is illustrated in FIG. 14. FIG. 14(*a*) illustrates a case where the total flow rate of the first gas was set to 2.16 slm, FIG. 14(*b*) illustrates a case where the total flow rate of the first gas was set to 4.00 slm, and FIG. 14(*c*) illustrates a case where the total flow rate of the first gas was set to 9.00 slm. Further, FIG. 14(*d*) illustrates the temperature gradation in FIGS. 14(*a*) to 14(*c*).

As illustrated in FIG. 14, in the third example, the first gas preheated in the second flow channel 5 and the low-temperature second gas were mixed with each other so that the first gas and the second gas flowing through the second flow channel 5 had a uniform temperature in the temperature range lower than the preheating temperature of the first gas from the lower side of the second flow channel 5 to the upper side thereof. Moreover, as obvious from FIGS. 14(*a*) to 14(*c*), even when the flow rate of the first gas was increased, the first gas and the second gas flowing through the second flow channel 5 were maintained at the uniform temperature.

[Evaluation of Numerical Analysis]

In the second example and the third example, since the heat uniformity of the gas was higher than that of the second comparative example, it was understood that the carbon nanotube could be effectively grown.

Third Comparative Example

Figure 15:
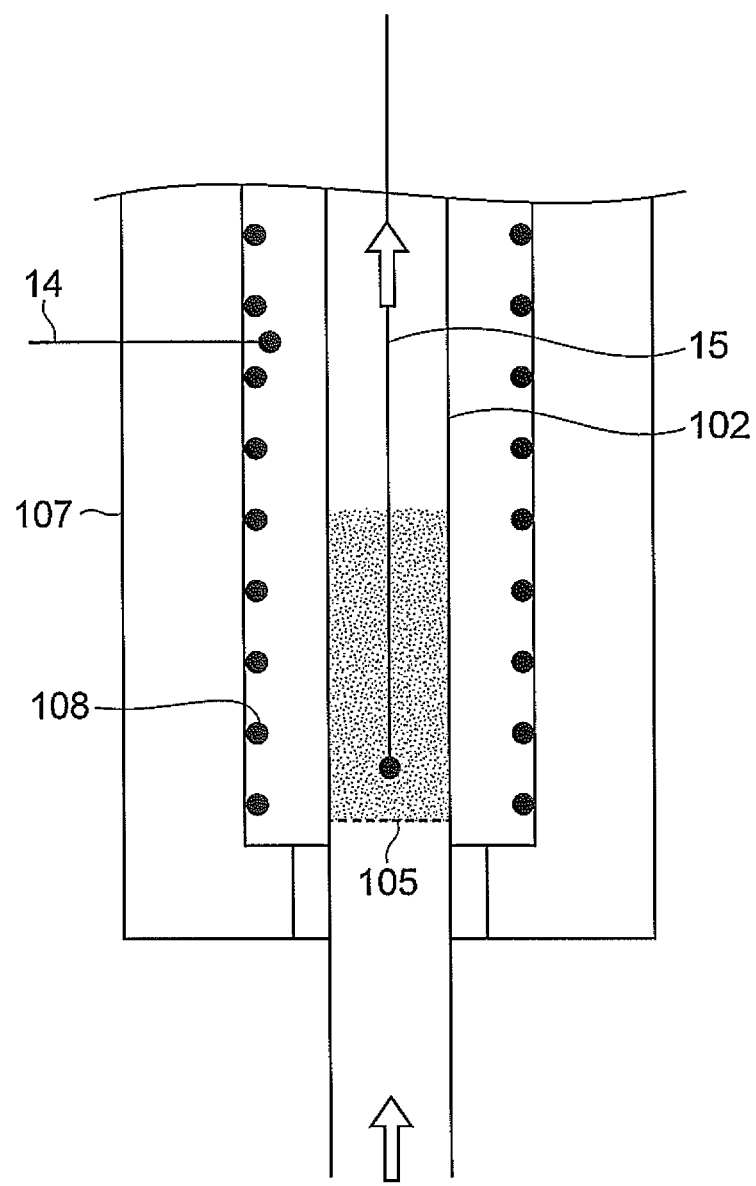
FIG. 15 is a schematic top view illustrating a reaction tube of a third comparative example.

The temperature distribution obtained when using the reaction tube 101 illustrated in FIG. 5 as the reaction tube while the catalyst carrying support medium was not charged in the straight tube part 102 was measured by a measurement thermocouple. Specifically, as illustrated in FIG. 15, the periphery of the straight tube part 102 was covered by a heat insulation material 107 and a heating device 108 was disposed between the straight tube part 102 and the heat insulation material 107. As the experiment condition, the inside diameter of the straight tube part 102 was set to 22 mm, the length of the heating part 106 was set to 300 mm, the temperature at the installation place of the reaction tube 101 was set to 27° C., and the heating temperature of the heating device 108 was set to 820° C. Further, the flow rate of the first gas supplied to the inlet 103 was changed so that the total flow rate of the first gas supplied to the inlet 103 was set to 3.16 slm, 5.00 slm, and 10.00 slm.

Figure 16:
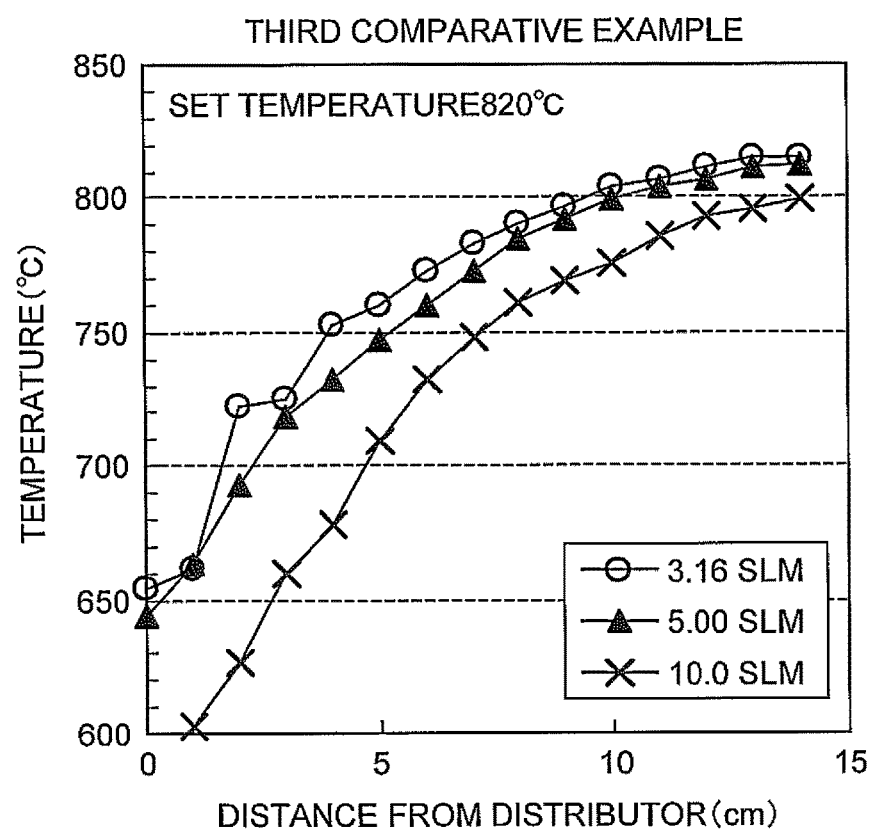
FIG. 16 is a diagram illustrating a temperature distribution measurement result of the third comparative example.

Then, the heating temperature of the heating device 108 was set to the temperature measured at the upper position of 12 cm from the distributor 105 by the control thermocouple 14 inserted between the straight tube part 102 and the heat insulation material 107. Further, the temperature inside the straight tube part 102 was measured by the measurement thermocouple 15 inserted into the straight tube part 102, and the measurement temperature was stored so as to correspond to the distance to the upper position from the distributor 105. The measurement result is illustrated in FIG. 16.

Fourth Example

Figure 17:
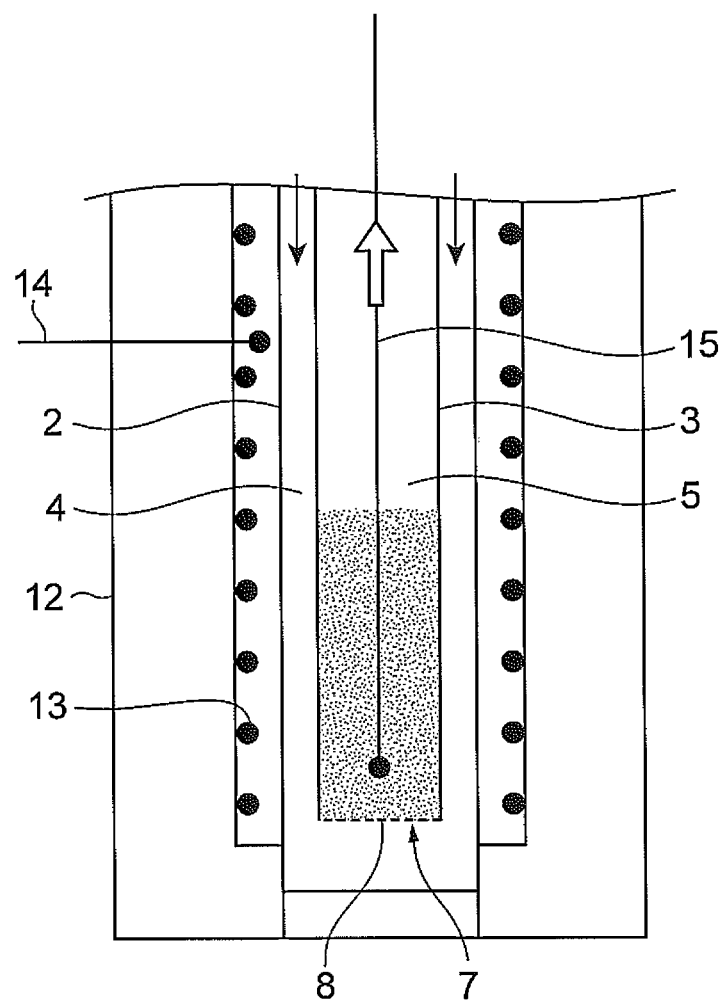
FIG. 17 is a schematic top view illustrating a heat exchanger type reaction tube of a fourth example.

The temperature distribution obtained when using the heat exchanger type reaction tube 1 illustrated in FIG. 1 as the reaction tube while the catalyst carrying support medium was not charged in the second flow channel 5 was measured by the measurement thermocouple. Specifically, as illustrated in FIG. 17, the periphery of the first tube part 2 was covered by a heat insulation material 12 and a heating device 13 was disposed between the first tube part 2 and the heat insulation material 12. As the experiment condition, the inside diameter of the first tube part 2 (the outside diameter of the first flow channel 4) was set to 35 mm, the inside diameter of the second tube part 3 (the outside diameter of the second flow channel 5) was set to 22 mm, the length of the heating part 11 was set to 300 mm, the distance from the bottom surface of the first tube part 2 to the distributor 8 was set to 10 mm, the temperature at the installation place of the heat exchanger type reaction tube 1 was set to 27° C., and the heating temperature of the heating device 13 was set to 820° C. Further, the flow rate of the first gas supplied to the inlet 6 was changed so that the total flow rate of the first gas supplied to the inlet 6 was set to 3.16 slm, 5.00 slm, and 10.00 slm.

Figure 18:
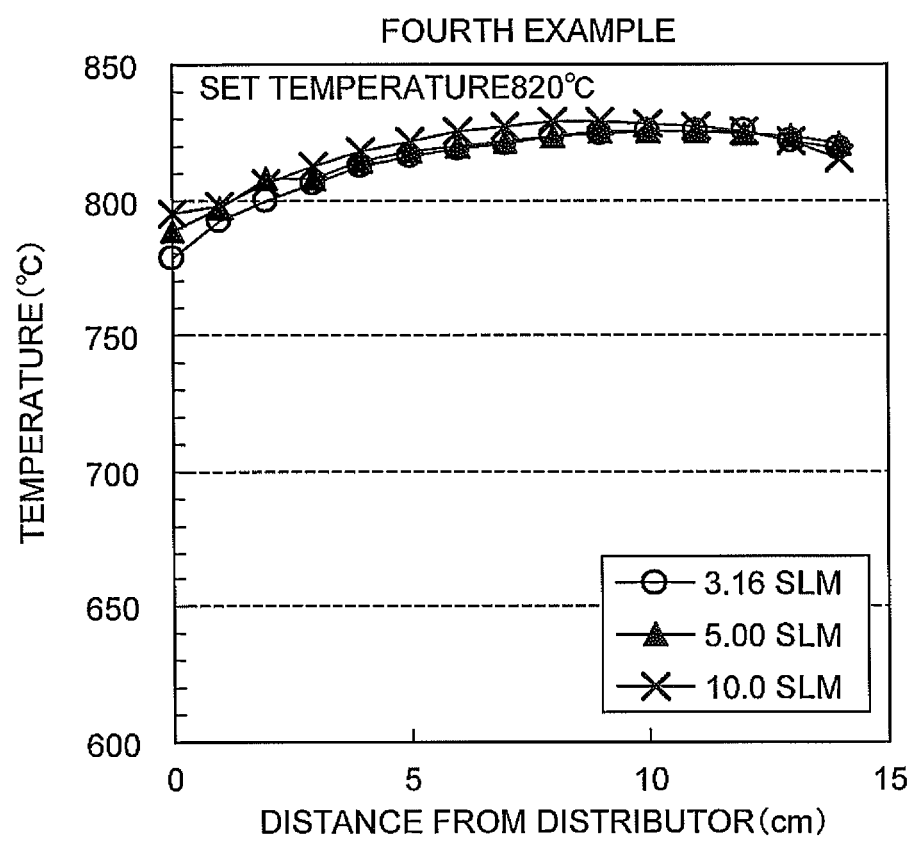
FIG. 18 is a diagram illustrating a temperature distribution measurement result of the fourth example.

Then, the heating temperature of the heating device 13 was set to the temperature measured at the upper position of 12 cm from the distributor 8 by the control thermocouple 14 inserted between the first tube part 2 and the heat insulation material 12. Further, the temperature inside the second flow channel 5 was measured by the measurement thermocouple 15 inserted into the second flow channel 5, and the measurement temperature was stored so as to correspond to the distance to the upper position from the distributor 8. The measurement result is illustrated in FIG. 18.

Fifth Example

Figure 19:
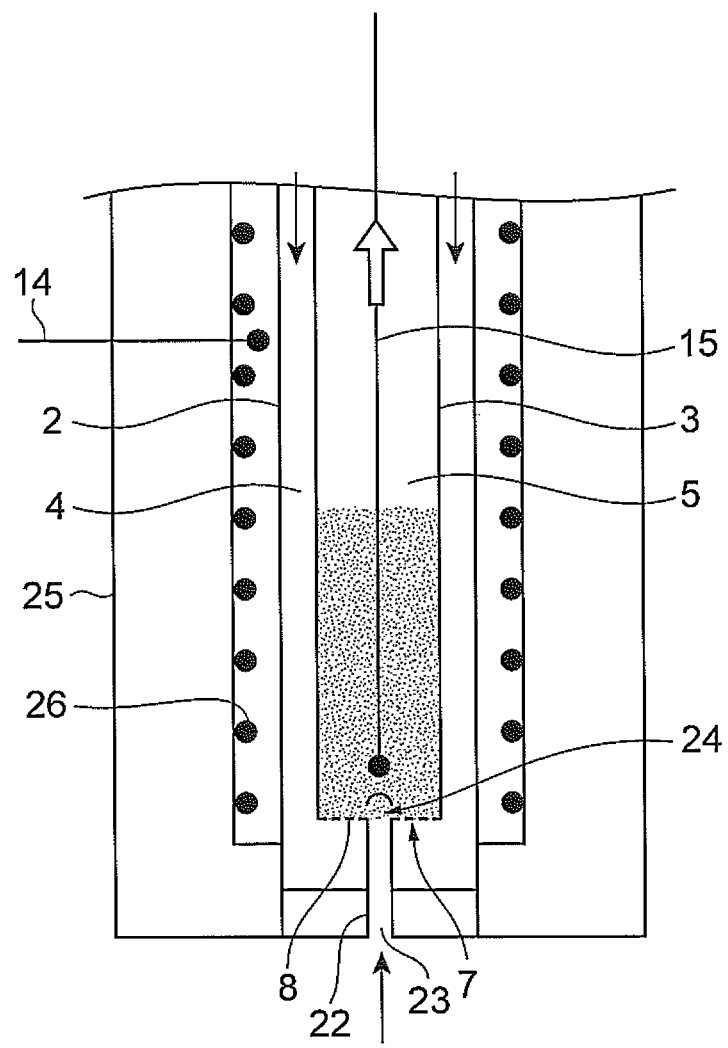
FIG. 19 is a schematic top view illustrating a heat exchanger type reaction tube of a fifth example.

The temperature distribution obtained when using the heat exchanger type reaction tube 21 illustrated in FIG. 2 as the reaction tube while the catalyst carrying support medium was not charged in the second flow channel 5 was measured by the measurement thermocouple. Specifically, as illustrated in FIG. 19, the periphery of the first tube part 2 was covered by a heat insulation material 25 and a heating device 26 was disposed between the first tube part 2 and the heat insulation material 25. As the experiment condition, the inside diameter of the first tube part 2 (the outside diameter of the first flow channel 4) was set to 35 mm, the inside diameter of the second tube part 3 (the outside diameter of the second flow channel 5) was set to 22 mm, the inside diameter of the third tube part 22 (the outside diameter of the third flow channel 23) was set to 2 mm, the length of the heating part 11 was set to 300 mm, the distance from the bottom surface of the first tube part 2 to the distributor 8 was set to 10 mm, the temperature at the installation place of the heat exchanger type reaction tube 1 was set to 27° C., and the heating temperature of the heating device 13 was set to 820° C. Further, the flow rate of the first gas supplied to the inlet 6 was changed so that the total flow rate of the first gas supplied to the inlet 6 was set to 2.16 slm, 4.00 slm, and 9.00 slm. The flow rate of the second gas supplied to the third flow channel 23 was set to be the same so that the total amount of the second gas supplied to the third flow channel 23 was set to 1.00 slm. That is, the total flow rate of the first gas and the second gas supplied to the second flow channel 5 was set to 3.16 slm, 5.00 slm, and 10.00 slm.

Figure 20:
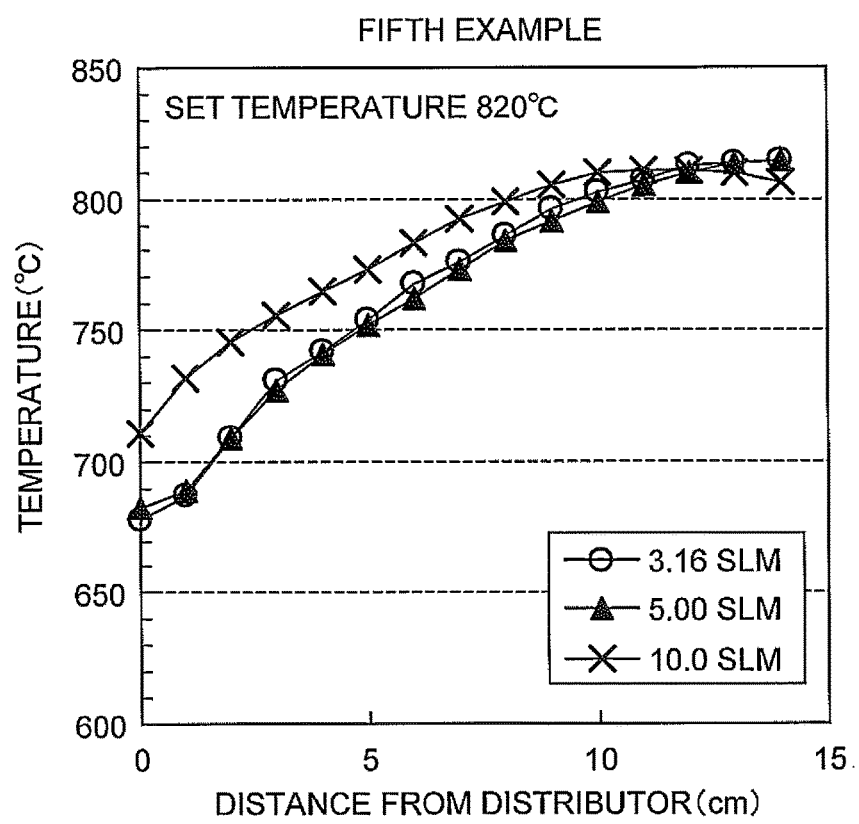
FIG. 20 is a diagram illustrating a temperature distribution measurement result of the fifth example.

Then, the heating temperature of the heating device 13 was set to the temperature measured at the upper position of 12 cm from the distributor 8 by the control thermocouple 14 inserted between the first tube part 2 and the heat insulation material 12. Further, the temperature inside the second flow channel 5 was measured by the measurement thermocouple 15 inserted into the second flow channel 5, and the measurement temperature was stored so as to correspond to the upper position from the distributor 8. The measurement result is illustrated in FIG. 20.

[Evaluation of Actual Measurement]

Figure 21:
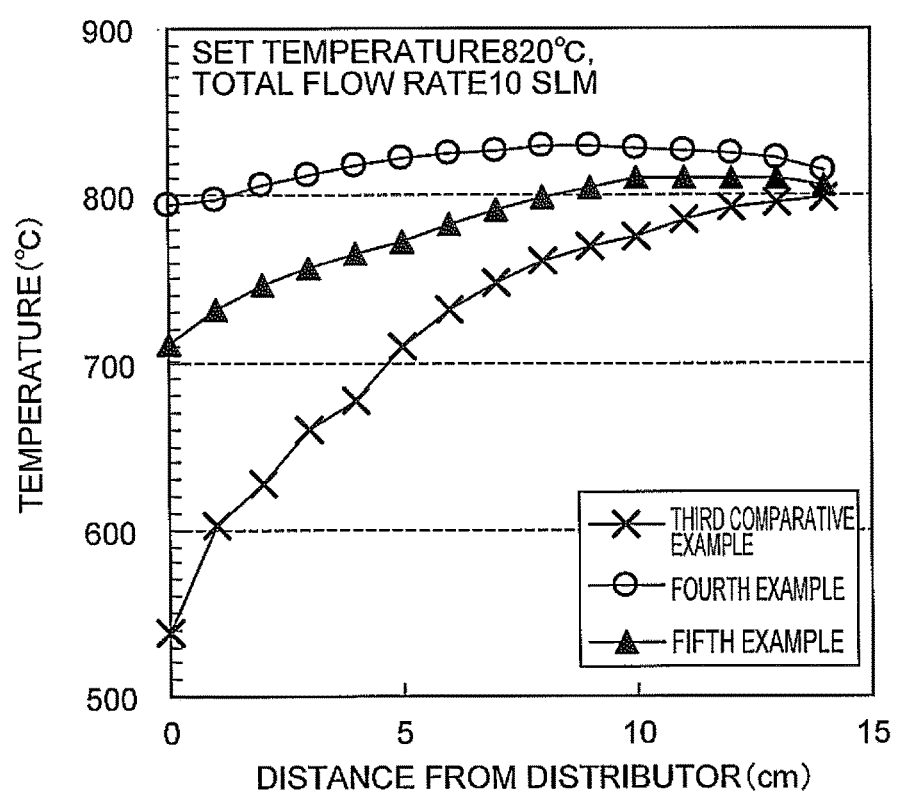
FIG. 21 is a diagram illustrating a measurement result when the total flow rate of the gas is 10.00 slm in the third comparative example, the fourth example, and the fifth example.

FIG. 21 illustrates the measurement result when the total flow rate of the gas is 10.00 slm in the third comparative example, the forth example, and the fifth example. As illustrated in FIG. 21, in the third comparative example, the temperature of the gas is about 540° C. at the distributor 105, but in the fourth example and the fifth example, the temperature of the gas is already about 800° C. at the distributor 8. Further, in the third comparative example, the measurement temperature is largely different in response to the distance from the distributor 105, but in the fourth example and the fifth example, a change in measurement temperature in response to the distance from the distributor 8 largely decreases compared to the third comparative example. Moreover, as illustrated in FIGS. 16, 18, and 20, in the fourth example and the fifth example, a change in measurement temperature in response to the distance from the distributor largely decreases compared to the third comparative example even when the total flow rate changes.

Figure 22:
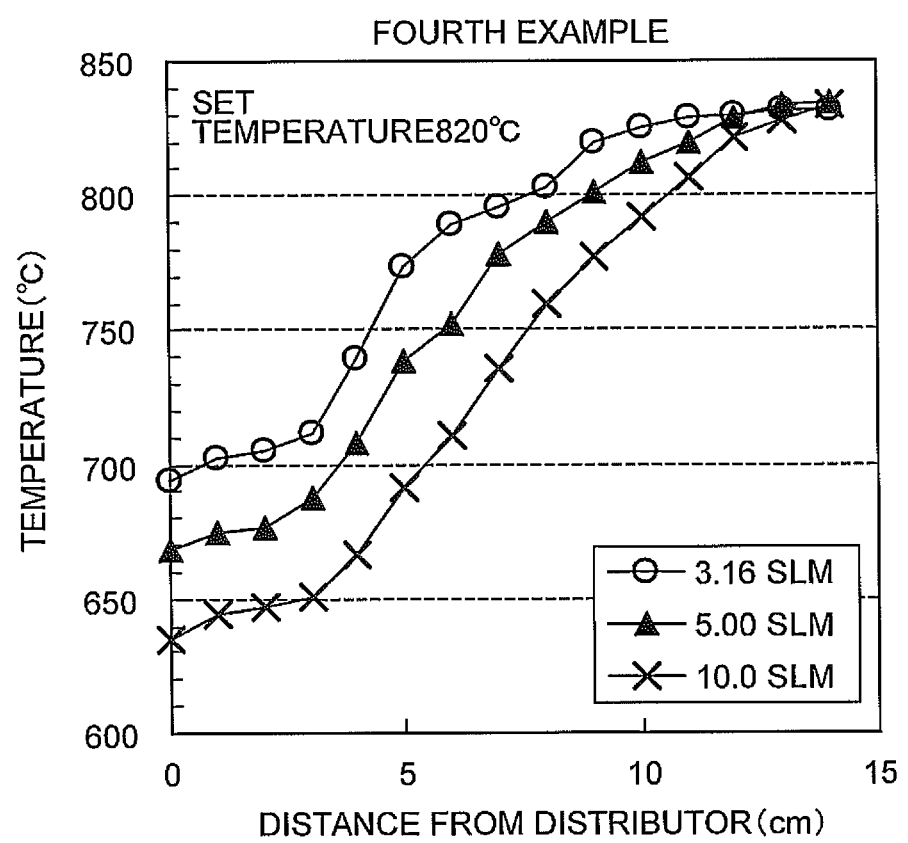
FIG. 22 is a diagram illustrating a temperature distribution measurement result of a fourth comparative example.

Accordingly, it was found that the carbon nanotube could be effectively grown in the fourth example and the fifth example compared to the third comparative example Fourth Comparative Example The temperature distribution of the reaction tube was measured at the same condition as the third comparative example except that the catalyst carrying support medium was charged in the straight tube part 102. The measurement result is illustrated in FIG. 22.

Sixth Example

Figure 23:
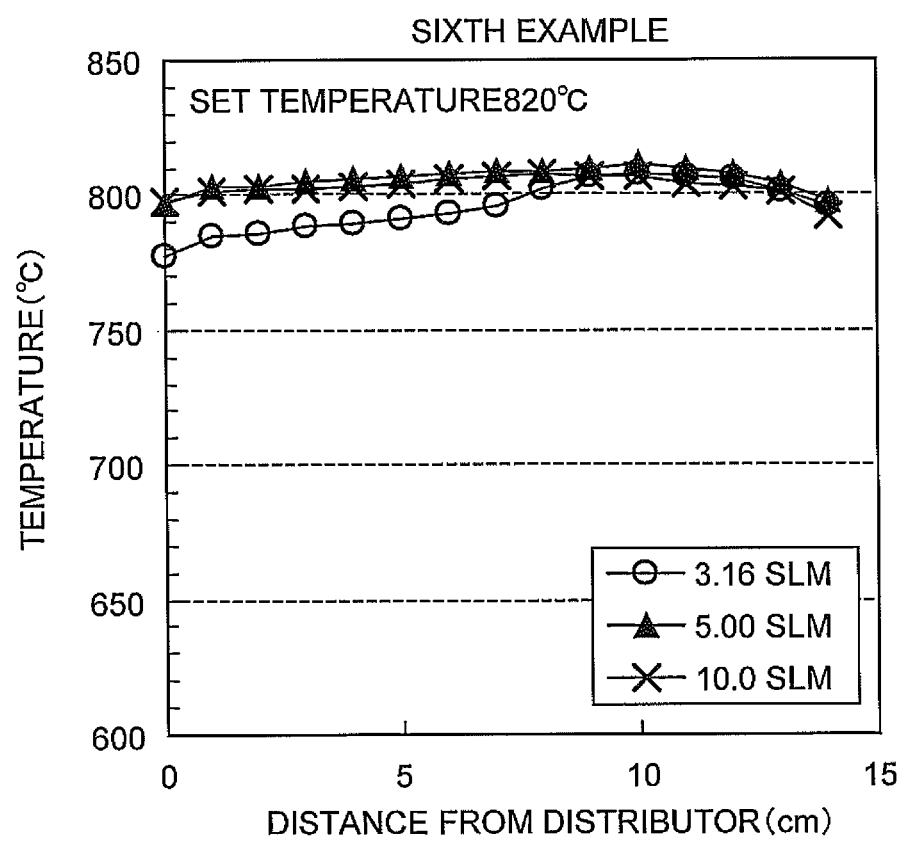
FIG. 23 is a diagram illustrating a temperature distribution measurement result of a sixth example.

The temperature distribution of the exchange type reaction tube was measured at the same condition as the fourth example except that the catalyst carrying support medium was charged in the second flow channel 5. The measurement result is illustrated in FIG. 23.

Seventh Example

Figure 24:
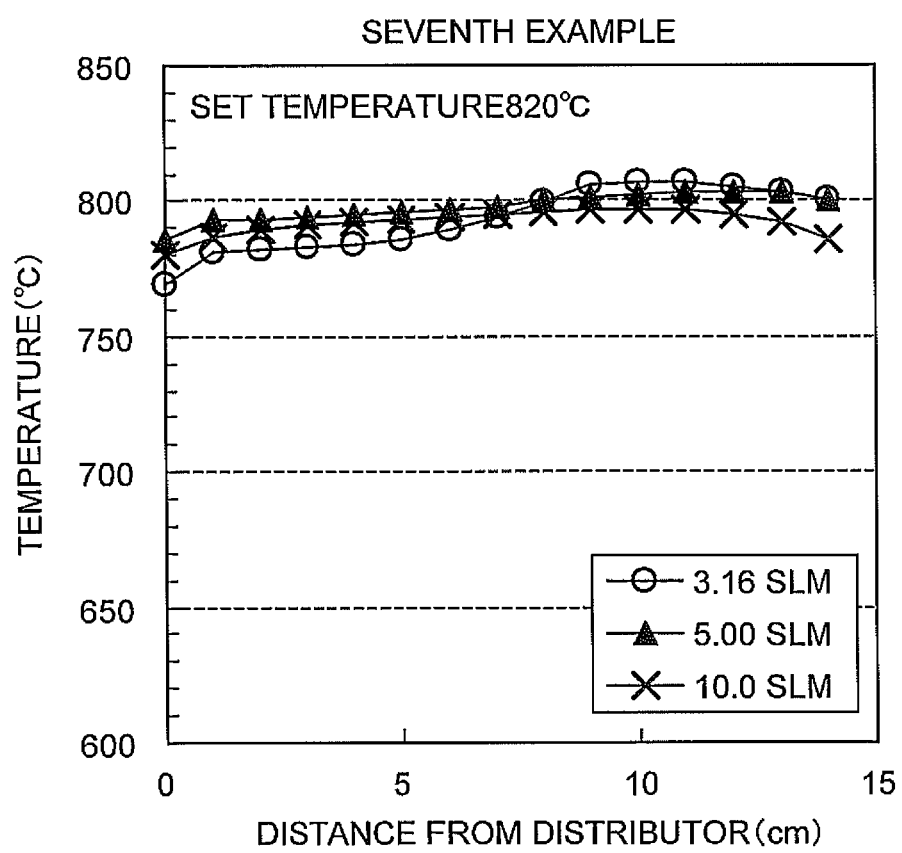
FIG. 24 is a diagram illustrating a temperature distribution measurement result of a seventh example.

The temperature distribution of the exchange type reaction tube was measured at the same condition as the fifth embodiment except that the catalyst carrying support medium was charged in the second flow channel 5. The measurement result is illustrated in FIG. 24.

[Evaluation of Actual Measurement]

Figure 25:
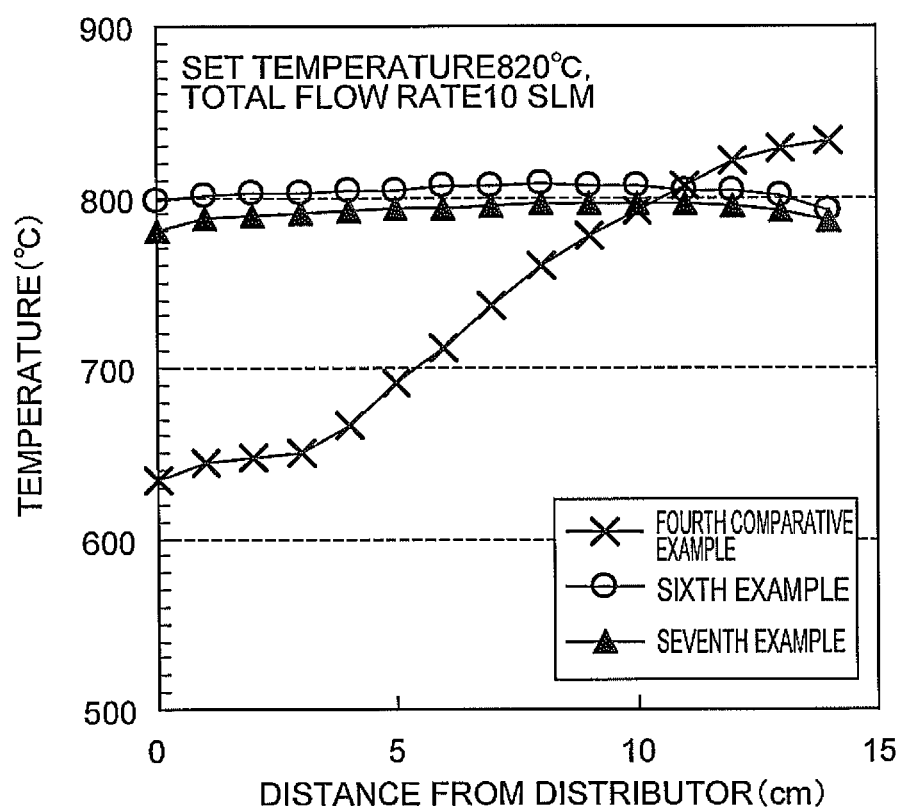
FIG. 25 is a diagram illustrating a measurement result when the total flow rate of the gas is 10.00 slm in the fourth comparative example, the sixth example, and the seventh example.

FIG. 25 illustrates the measurement result when the total flow rate of the gas is 10.00 slm in the fourth comparative example, the sixth example, and the seventh example. As illustrated in FIG. 25, in the fourth comparative example, the temperature of the gas is about 640° C. at the point of the distributor 105, but in the sixth example and the seventh example, the temperature of the gas is already about 800° C. at the point of the distributor 8. Further, in the fourth comparative example, the measurement temperature is largely different in response to the distance from the distributor 105, but in the sixth example and the seventh example, a change in measurement temperature in response to the distance from the distributor 8 largely decreases compared to the third comparative example. Moreover, as illustrated in FIGS. 22 to 24, in the sixth example and the seventh example, a change in measurement temperature in response to the distance from the distributor largely decreases compared to the fourth comparative example even when the total flow rate changes.

Accordingly, it was found that the carbon nanotube could be effectively grown in the sixth example and the seventh example compared to the fourth comparative example.

Moreover, it was found that the carbon nanotube of the invention could be effectively grown regardless of the existence of the catalyst carrying support medium.

Fifth Comparative Example

The temperature distribution inside the straight tube part 102 obtained when using the reaction tube 101 illustrated in FIG. 5 as the reaction tube was measured by the measurement thermocouple. The condition was the same as that of the third comparative example except that the inside diameter of the straight tube part 102 was set to 23 mm and the catalyst carrying support medium was charged in the straight tube part 102.

Figure 28:
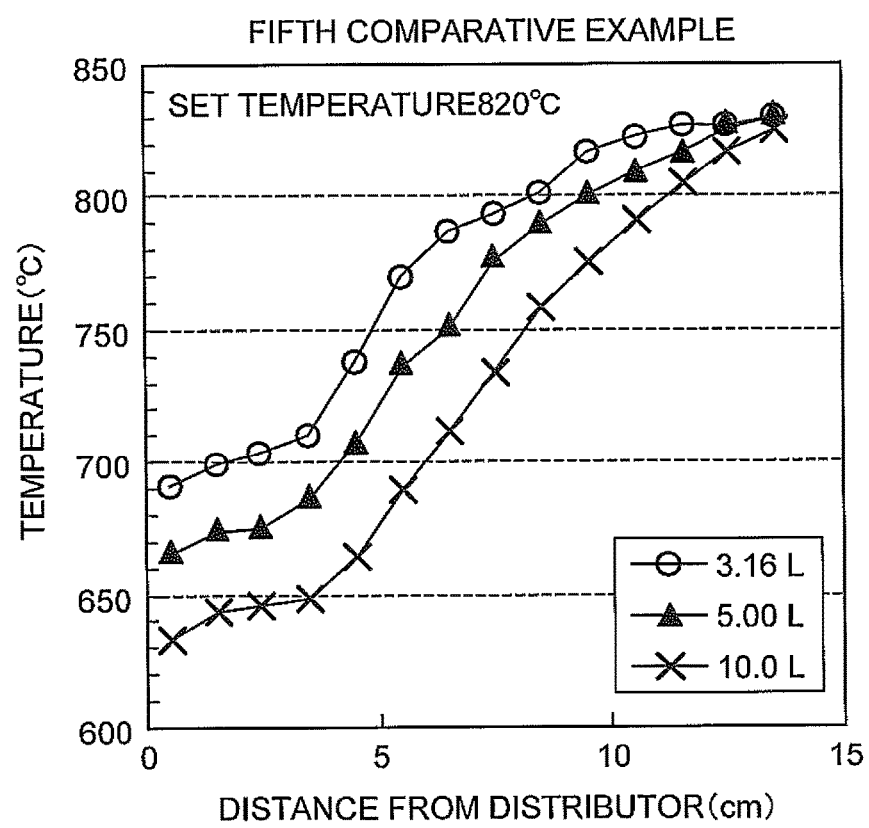
FIG. 28 is a diagram illustrating a temperature distribution analysis result of a fifth comparative example.

Then, the temperature inside the straight tube part 102 was measured by the measurement thermocouple 15 inserted into the straight tube part 102, and the measurement temperature was stored so as to correspond to the distance to the upper position from the distributor 105. The measurement result is illustrated in FIG. 28.

Eighth Example

The temperature distribution inside the second flow channel 5 obtained when using the heat exchanger type reaction tube 21 illustrated in FIG. 2 as the reaction tube was measured by the measurement thermocouple. Further, in the eighth example, the heat exchanger type reaction tube 21 having the distributor 8 penetrating the third tube part 22 was used. The condition was the same as that of the fifth embodiment except that the inside diameter of the first tube part 2 (the outside diameter of the first flow channel 4) was set to 50 mm, the inside diameter of the second tube part 3 (the outside diameter of the second flow channel 5) was set to 40 mm, the inside diameter of the third tube part 22 (the outside diameter of the third flow channel 23) was set to 2 mm, and the catalyst carrying support medium was charged in the second flow channel 5.

Figure 29:
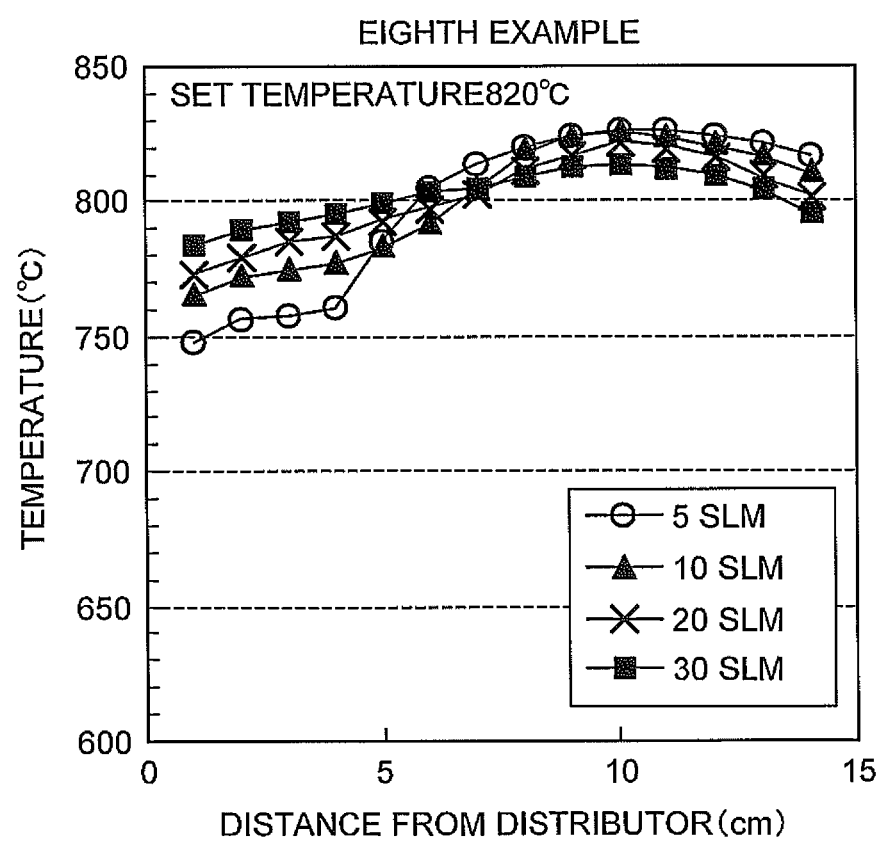
FIG. 29 is a diagram illustrating a temperature distribution analysis result of an eighth example.

Then, the temperature inside the second flow channel 5 was measured by the measurement thermocouple 15 inserted into the second flow channel 5, and the measurement temperature was stored so as to correspond to the distance to the upper position from the distributor 8. The measurement result is illustrated in FIG. 29.

[Evaluation of Actual Measurement]

As illustrated in FIG. 28, in the fifth comparative example, the measurement temperature is largely different in response to the distance from the distributor 105, and the temperature of the gas is not high unless the position is away from the distributor 105. That is, in the fifth comparative example, the beads as the support medium are cooled by the high-speed gas stream, and hence a problem arises in that the scale-up of the device may not be performed. Furthermore, an increase in the flow rate of the gas is equal to an increase in the diameter of the tube from the viewpoint of effect.

For this reason, when the fifth comparative example is used to synthesize the carbon nanotube, the catalyst is carried by the beads in a manner such that the low-temperature beads contact the catalyst source gas. For this reason, the possibility of the sticking of the catalyst is low, and the catalytic particles are selectively grown. Thus, the catalytic particles are formed largely and sparsely. As a result, the generated carbon nanotube is thickened.

Moreover, in the fifth comparative example, since the catalyst source gas is supplied through the distributor 105, the catalyst is stuck to the distributor 105, and hence the holes of the distributor 105 are blocked. As a result, since there is a need to frequently clean the distributor 105, the number of times of repeating the cycle of synthesizing the carbon nanotube is largely limited.

On the contrary, as illustrated in FIG. 29, in the eighth example, a change in measurement temperature in response to the distance from the distributor 8 largely decreases, and hence the temperature of the gas is already high at the position of the distributor 8. That is, in the eighth example, since the first gas flowing through the second flow channel 5 exchanges heat with the second gas flowing through the first flow channel 4 and is heated by the heating device 26, the first gas flowing through the second flow channel 5 may be uniformly heated even when the flow rate of the first gas is increased and the scale is increased.

For this reason, when the eighth example is used to synthesize the carbon nanotube, the catalyst is carried by the beads in a manner such that the high-temperature beads contact the catalyst source gas. Thus, the possibility of the sticking of the catalyst is high, and the catalytic particles are formed densely in a small size. As a result, the generated carbon nanotube is thinned.

Moreover, in the eighth example, since the catalyst source gas is supplied to the second flow channel 5 from the third tube part 22 penetrating the distributor 8, the catalyst is not stuck to the distributor 8. As a result, since there is no need to clean the distributor 105, it is possible to repeat the cycle of synthesizing the carbon nanotube.

Sixth Comparative Example

The carbon nanotube was synthesized according to a CVD process by using the reaction tube 101 of the fifth comparative example. Furthermore, the inside diameter of the straight tube part 102 of the reaction tube 101 was set to 22 mm, and the cross-sectional area of the gas flow channel was set to about 380 mm$^2$.

In the synthesis of the carbon nanotube, a catalyst carrying process was performed in which the catalyst source gas was supplied from the inlet 103 so that the catalyst was carried on the beads as the carrying medium. Subsequently, a CVD process was performed in which the feed gas was supplied from the inlet 103 for 20 minutes so that the carbon nanotube was synthesized on the beads. In the catalyst carrying process, the deposition process was performed in which a first catalyst source gas and a second catalyst source gas were first supplied from the inlet 103 for 2 minutes so that the catalyst was deposited on the beads as the carrying medium. Next, the reduction process was performed in which a reducing gas was supplied from the inlet 103 for 10 minutes so that the catalyst deposited on the beads was reduced into fine particles. The total flow rate of the first catalyst source gas was set to 21.225 slm, the total flow rate of the second catalyst source gas was set to 21.425 slm, the total flow rate of the reducing gas was set to 9.48 slm, and the total flow rate of the feed gas was set to 9.48 slm. The elements of the first catalyst source gas, the second catalyst source gas, the reducing gas, and the feed gas are illustrated in FIG. 30. The other conditions were the same as those of the third comparative example.

Subsequently, a separation gas was supplied from the inlet 103 so as to separate the carbon nanotube from the catalytic particle, and the separated carbon nanotube was collected. Argon was used as the separation gas.

Figure 31:
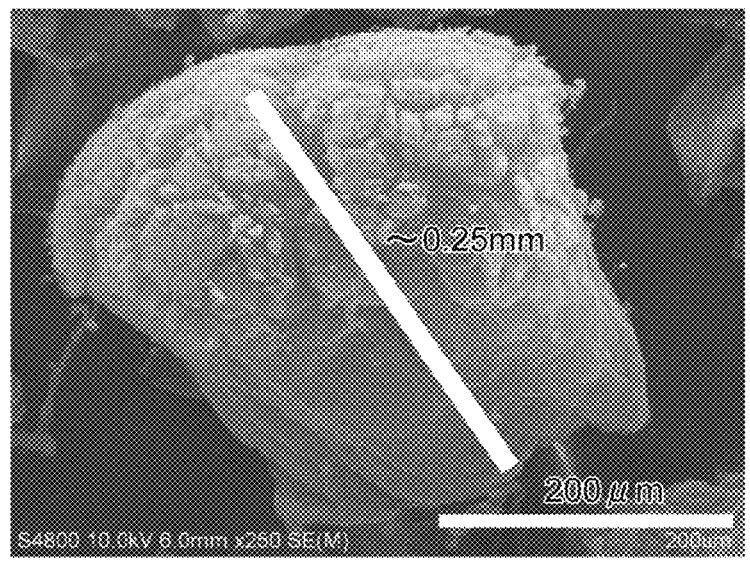
FIG. 31 is a SEM image of the synthesized carbon nanotube of the sixth comparative example.
Figure 31:
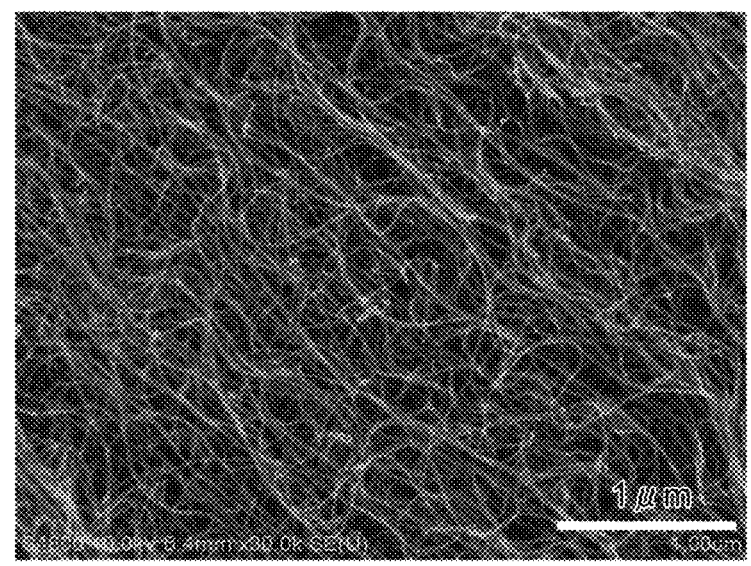

FIG. 31 is a SEM image of the carbon nanotube synthesized in the sixth comparative example. As illustrated in FIG. 31, in the sixth comparative example, the carbon nanotube was grown on the beads by the length of about 0.25 mm. Further, the weight of the collected carbon nanotube was measured, and the weight was 0.26 g for each cycle of synthesizing the carbon nanotube.

Ninth Example

The carbon nanotube was synthesized according to the CVD process by using the heat exchanger type reaction tube 21 of the eighth example. Furthermore, the inside diameter of the first tube part 2 of the heat exchanger type reaction tube 21 was set to 40 mm, and the cross-sectional area of the gas flow channel was set to about 1260 mm².

In the synthesis of the carbon nanotube, a catalyst carrying process was performed in which the catalyst source gas was supplied from the third tube part 22 so that the catalyst was carried on the beads as the carrying medium. Subsequently, a CVD process was performed in which the feed gas was supplied from the inlet 6 so that the carbon nanotube was synthesized on the beads. In the catalyst carrying process, the deposition process was performed in which a first catalyst source gas and a second catalyst source gas were first supplied from the inlet 103 for 2 minutes so that the catalyst was deposited on the beads as the carrying medium. Next, the reduction process was performed in which a reducing gas was supplied from the inlet 103 for 10 minutes so that the catalyst deposited on the beads was reduced into fine particles. The total flow rate of the first catalyst source gas was set to 21.225 slm, the total flow rate of the second catalyst source gas was set to 21.425 slm, the total flow rate of the reducing gas was set to 9.48 slm, and the total flow rate of the feed gas was set to 9.48 slm. The elements of the first catalyst source gas, the second catalyst source gas, the reducing gas, and the feed gas are illustrated in FIG. 30. The other conditions were the same as those of the fifth example.

Subsequently, a separation gas was supplied from the inlet 6 so as to separate the carbon nanotube from the catalytic particle, and the separated carbon nanotube was collected. Argon was used as the separation gas.

Figure 32:
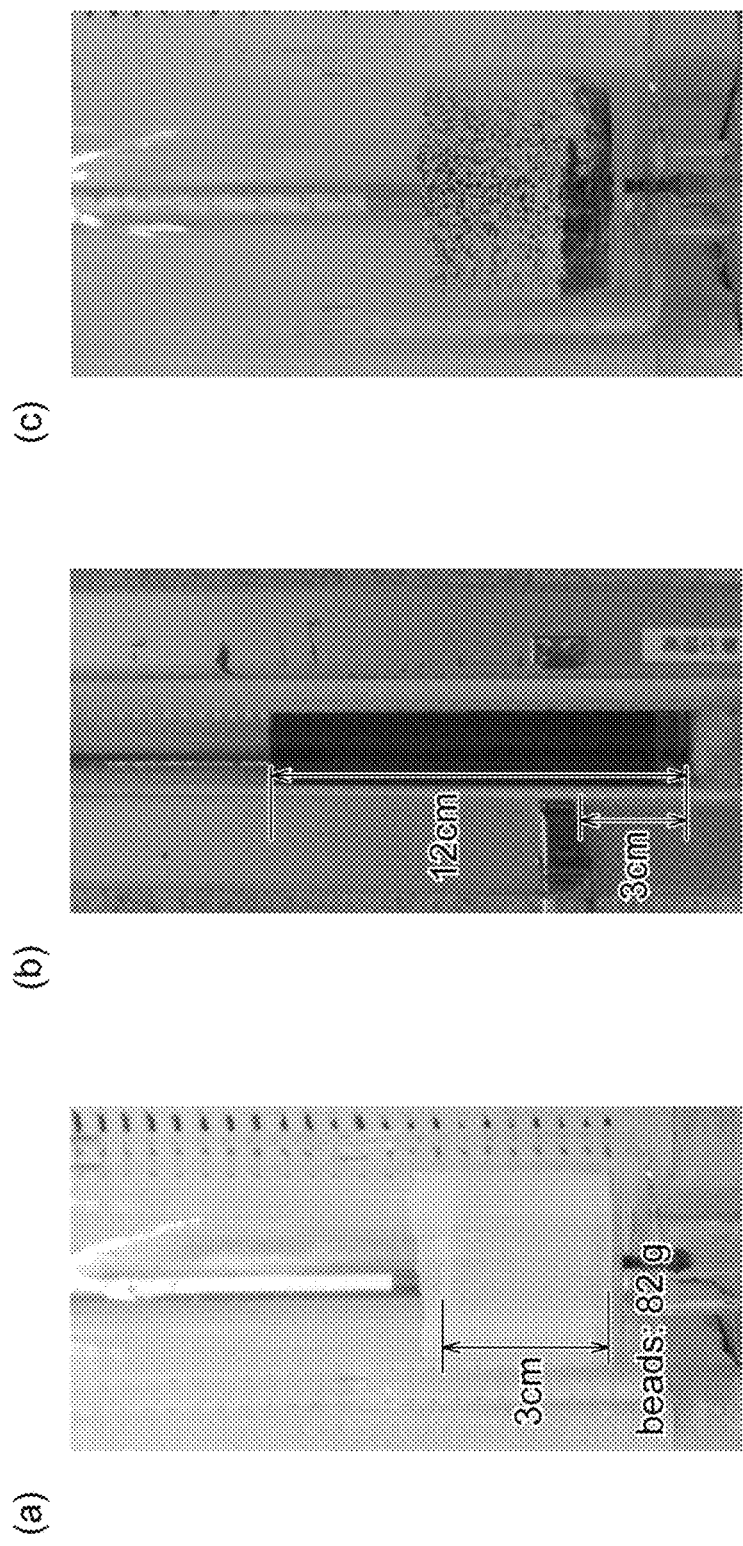
FIG. 32 illustrates a picture of a reaction tube of the ninth example, where

FIG. 32 is a picture of the reaction tube of the ninth example, where FIG. 32(*a*) is a picture of the reaction tube before the catalyst source gas and the feed gas are supplied thereto, FIG. 32(*b*) is a picture of the reaction tube in which the catalyst source gas and the feed gas are supplied thereto so as to synthesize the carbon nanotube, and FIG. 32(*c*) is a picture of the reaction tube from which the carbon nanotube is separated therefrom.

Figure 33:
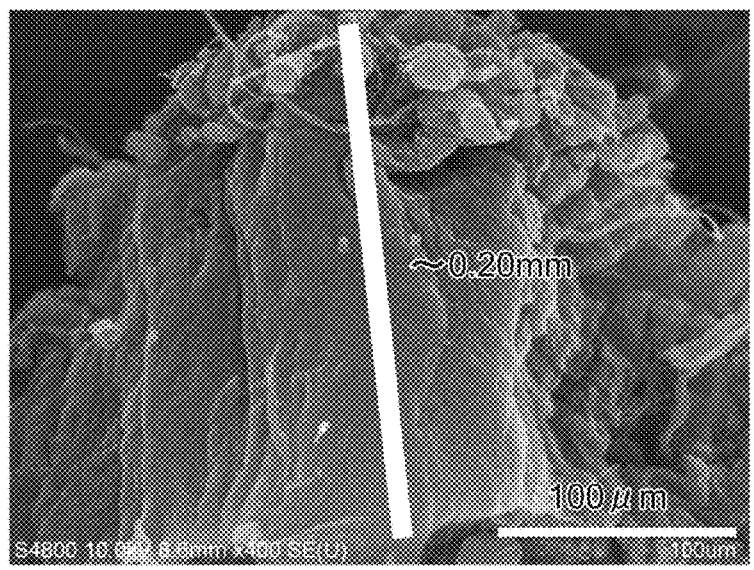
FIG. 33 is a SEM image of the synthesized carbon nanotube of the ninth example.
Figure 33:
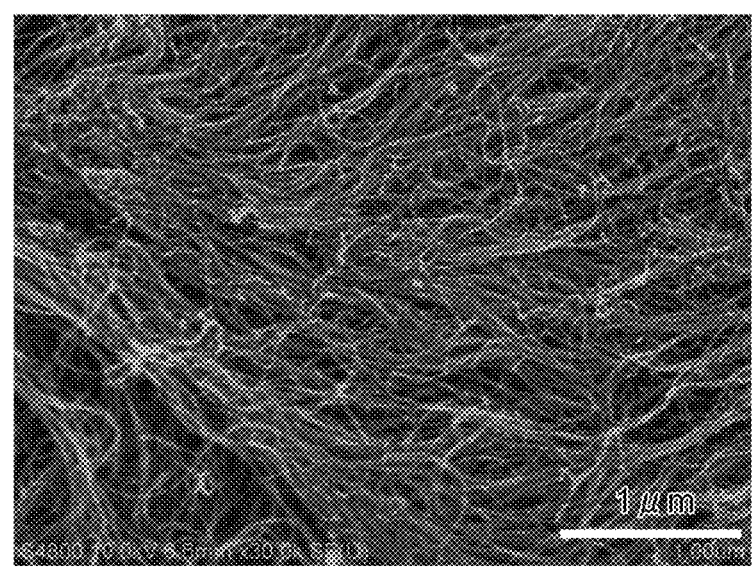

FIG. 33 is a SEM image of the carbon nanotube synthesized in the ninth example. As illustrated in FIG. 33, in the ninth example, the carbon nanotube was grown on the beads by the length of about 0.2 mm while being arranged longitudinally. Further, the weight of the collected carbon nanotube was measured, and the weight was 0.70 g for each cycle of synthesizing the carbon nanotube.

Figure 34:
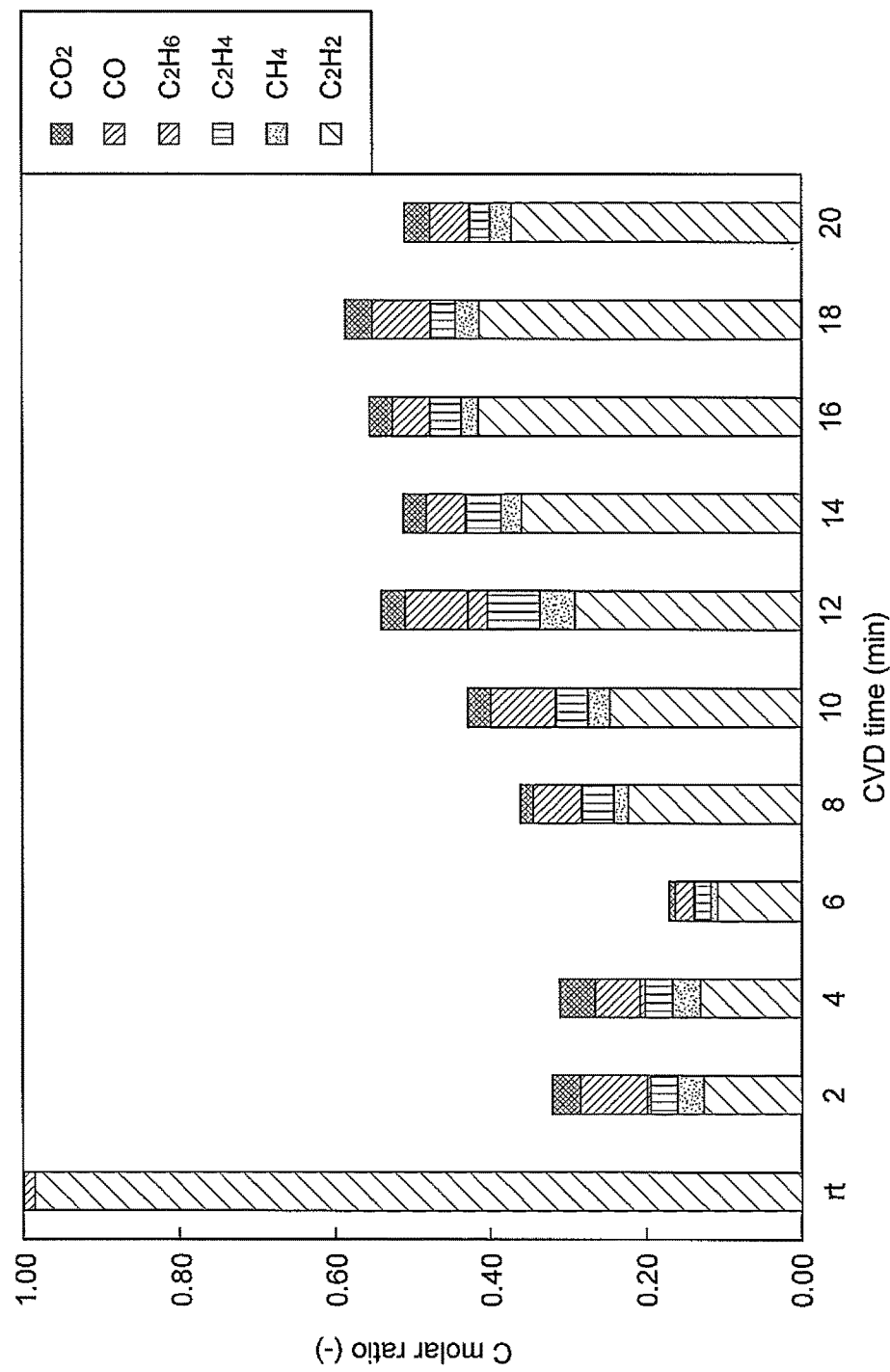
FIG. 34 is a diagram illustrating a carbon source analysis result of a feed gas discharged from an outlet.

FIG. 34 is a diagram illustrating the analysis result of the carbon source in the feed gas discharged from the outlet 10. In FIG. 34, rt indicates the analysis result of the carbon source in the feed gas supplied from the inlet 6. As illustrated in FIG. 34, since the ratio in which $C_2H_2$ is transformed into the carbon nanotube is 60 to 82% for 1 to 10 minutes, it is considered that the carbon nanotube is grown fast at this time. Further, since the ratio in which $C_2H_2$ is transformed into the carbon nanotube is 40% or less for 10 to 20 minutes, it is considered that the catalyst is deactivated at this time.

[Comparison between Sixth Comparative Example and Ninth Example]

When the sixth comparative example and the ninth example are compared, the cross-sectional area of the gas flow channel of the heat exchanger type reaction tube 21 of the ninth example was about 3 times that of the reaction tube 101 of the sixth comparative example, but the weight of the collected carbon nanotube was about 3 times that of the reaction tube 101 of the sixth comparative example. From such a result, since the heat exchanger type reaction tube 21 may be maintained at the uniform temperature range despite of the scale-up, it is considered that the productivity of the carbon nanotube may be improved. Furthermore, the inside diameter of the straight tube part 102 of the reaction tube 101 of the sixth comparative example was thickened similarly to the ninth example, but the carbon nanotube could not be synthesized.

Tenth Example

The carbon nanotube synthesized at the same condition as the ninth example except that the CVD process was performed for 25 minutes was collected.

Figure 35:
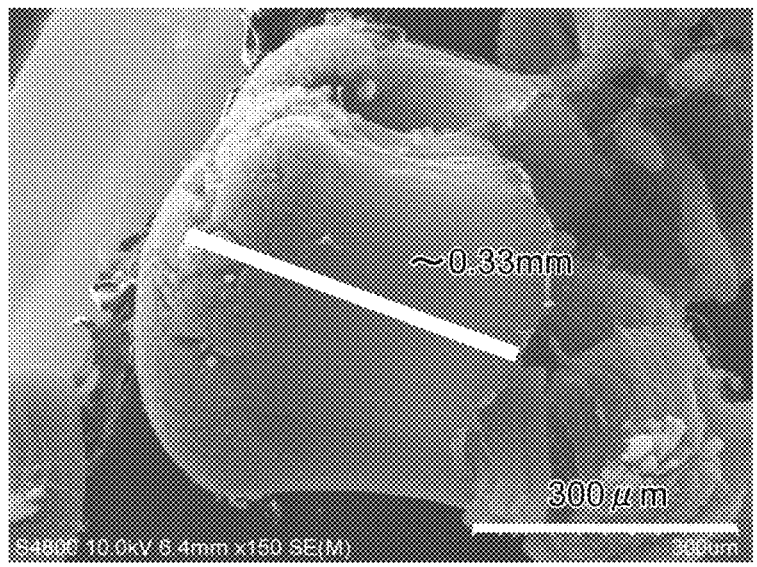
FIG. 35 is a SEM image of a synthesized carbon nanotube of a tenth example.
Figure 35:
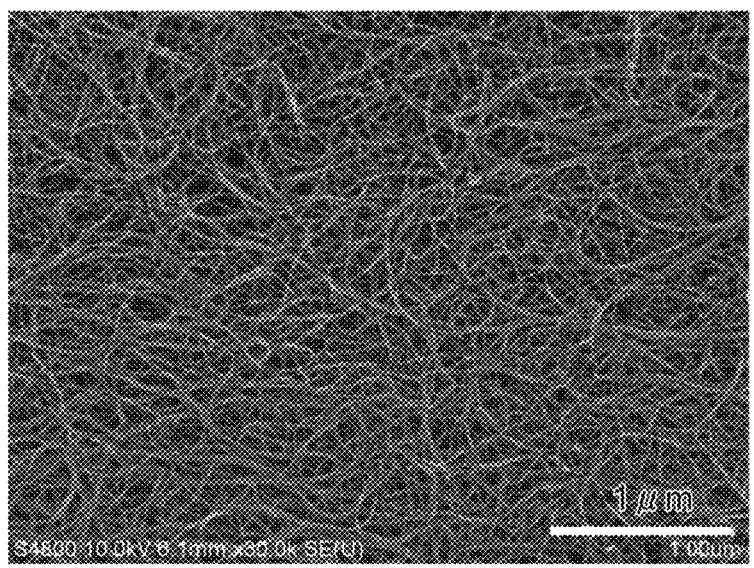

FIG. 35 is a SEM image of the synthesized carbon nanotube of the tenth example. As illustrated in FIG. 35, in the tenth example, the carbon nanotube was grown on the beads by the length of about 0.33 mm while being arranged longitudinally. Further, the weight of the collected carbon nanotube was measured, and the weight was 0.88 g for each cycle of synthesizing the carbon nanotube.

REFERENCE SIGNS LIST

1 heat exchanger type reaction tube, 2 first tube part, 3 second tube part, 4 first flow channel, 5 second flow channel, 6 inlet, 7 opening, 8 distributor, 9 enlarged tube part, 10 outlet, 11 heating part, 12 heat insulation material, 13 heating device, 14 control thermocouple, 15 measurement thermocouple, 21 heat exchanger type reaction tube, 22 third tube part, 23 third flow channel, 24 opening, 25 heat insulation material, 26 heating device, 31 first tube part, 32 second tube part, 33 second tube part, 34 first tube part, 41 first tube part, 42 second tube part, 43 third tube part, 51 first tube part, 51*a* upper portion, 51*b* heating part, 52 second tube part, 53 third tube part, 101 reaction tube, 102 straight tube part, 103 inlet, 104 outlet, 105 distributor, 106 heating part, 107 heat insulation material, 108 heating device

The invention claimed is:

1. A heat exchanger type reaction tube comprising:
   a first tube part that forms a first flow channel into which a first gas flows and in which the first gas moves down;
   a second tube part that is connected to the lower portion of the first flow channel, that forms a second flow channel in which the first gas moves up, and that holds a fluidization medium;
   a third tube part that forms a third flow channel into which a second gas flows, the third flow channel being connected to the second flow channel while not to the first flow channel; and
   a heating device that covers a predetermined length of the first tube part and a predetermined length of the second tube part,
   wherein the first flow channel and the second flow channel are adjacent to each other while being separated from each other by a partition wall,
   wherein the second flow channel is provided with a grating which holds the fluidization medium and through which the first gas passes,
   wherein the grating is placed at the lower end of the second flow channel,
   wherein the third tube part is connected to and penetrates the grating such that an opening of the third tube part into the second flow channel is provided above the grating, and
   wherein the heating device does not cover the third tube part except for portions of the third tube part within the first flow channel and the second flow channel, whereby preheating of the second gas caused by the heat exchange with the heating device is suppressed so that the second gas flowing through the third flow channel to the second flow channel is supplied at a lower temperature than the first gas supplied to the second flow channel.

2. The heat exchanger type reaction tube according to claim 1,
wherein the first tube part and the second tube part are formed as a double-tube structure in which the second tube part is disposed inside the first tube part.

3. The heat exchanger type reaction tube according to claim 2,
wherein the fluidization medium is a granular catalyst carrying support medium that carries carbon nanotube synthesis catalysts, and
wherein the first gas is a feed gas that contains a carbon source of a carbon nanotube.

4. The heat exchanger type reaction tube according to claim 1,
wherein the first tube part is formed by a single or plural tubes, and
wherein the first tube part and the second tube part are formed as a structure in which the first tube part is disposed outside the second tube part.

5. The heat exchanger type reaction tube according to claim 1,
wherein the first flow channel is disposed at a position where the preheating of the first gas by the heat exchange with the heating device and the second flow channel is promoted, and
wherein the third flow channel is disposed at a position where the preheating of the second gas by the heat exchange with the heating device and the second flow channel is suppressed.

6. The heat exchanger type reaction tube according to claim 1,
wherein the fluidization medium is a granular support medium,
wherein the first gas is a feed gas containing a carbon source of a carbon nanotube, and
wherein the second gas is a catalyst source gas containing carbon nanotube synthesis catalysts.

7. The heat exchanger type reaction tube according to claim 1,
wherein the first tube part is configured to be connected to a source of the first gas
wherein the third tube part is configured to be connected to a source of the second gas; and
wherein the first gas is different than the second gas.

8. The heat exchanger type reaction tube according to claim 7,
wherein the fluidization medium is a granular support medium,
wherein the first gas is a feed gas containing a carbon source of a carbon nanotube, and
wherein the second gas is a catalyst source gas containing carbon nanotube synthesis catalysts.

9. The heat exchanger type reaction tube according to claim 1,
wherein the first tube part is connected to a source of the first gas
wherein the third tube part is connected to a source of the second gas; and
wherein the first gas is different than the second gas.

10. The heat exchanger type reaction tube according to claim 9,
wherein the fluidization medium is a granular support medium,
wherein the first gas is a feed gas containing a carbon source of a carbon nanotube, and
wherein the second gas is a catalyst source gas containing carbon nanotube synthesis catalysts.

11. The heat exchanger type reaction tube according to claim 1,
wherein the third tube part extends vertically from a portion below the first tube part upwardly beyond the grating into the second tube part.

* * * * *

UNITED STATES PATENT AND TRADEMARK OFFICE
CERTIFICATE OF CORRECTION

PATENT NO. : 10,526,707 B2  
APPLICATION NO. : 14/424248  
DATED : January 7, 2020  
INVENTOR(S) : Suguru Noda Page 1 of 1

It is certified that error appears in the above-identified patent and that said Letters Patent is hereby corrected as shown below:

On the Title Page

Item (22), should read:  
PCT Filed: Aug. 28, 2013

Signed and Sealed this  
Seventh Day of April, 2020

Andrei Iancu  
*Director of the United States Patent and Trademark Office*